(12) United States Patent
Shibata

(10) Patent No.: US 7,644,342 B2
(45) Date of Patent: Jan. 5, 2010

(54) SEMICONDUCTOR MEMORY DEVICE

(75) Inventor: Noboru Shibata, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 286 days.

(21) Appl. No.: 11/414,826

(22) Filed: May 1, 2006

(65) Prior Publication Data

US 2006/0195766 A1    Aug. 31, 2006

Related U.S. Application Data

(63) Continuation of application No. 10/292,397, filed on Nov. 12, 2002, now Pat. No. 7,076,722.

(30) Foreign Application Priority Data

Nov. 21, 2001    (JP) .............................. 2001-356571

(51) Int. Cl.
*G06F 11/10*    (2006.01)
(52) U.S. Cl. ..................................... 714/773
(58) Field of Classification Search ................ 714/763, 714/772, 773; 365/200
See application file for complete search history.

(56) References Cited

U.S. PATENT DOCUMENTS

| | | | | |
|---|---|---|---|---|
| 5,226,043 A | | 7/1993 | Pughe et al. ................. 714/768 |
| 5,291,496 A | * | 3/1994 | Andaleon et al. ........... 714/757 |
| 5,343,426 A | | 8/1994 | Cassidy et al. ......... 365/189.02 |
| 5,699,368 A | | 12/1997 | Sakai et al. .................. 714/757 |
| 5,740,188 A | | 4/1998 | Olarig ........................ 714/763 |
| 5,754,563 A | * | 5/1998 | White .......................... 714/784 |
| 5,757,826 A | * | 5/1998 | Fredrickson ................. 714/784 |
| 5,784,391 A | * | 7/1998 | Konigsburg ................. 714/773 |
| 5,864,568 A | * | 1/1999 | Nemazie ...................... 714/769 |
| 5,901,152 A | * | 5/1999 | Tanaka et al. ................ 714/718 |
| 5,933,436 A | | 8/1999 | Tanzawa et al. ............. 714/762 |
| 6,158,040 A | * | 12/2000 | Ho .............................. 714/770 |

(Continued)

FOREIGN PATENT DOCUMENTS

JP    62214599 A    9/1987

(Continued)

OTHER PUBLICATIONS

Japanese language office action and its English translation for corresponding Japanese application 2001-356571 lists the references above.

(Continued)

*Primary Examiner*—Stephen M Baker
(74) *Attorney, Agent, or Firm*—Hogan & Hartson LLP

(57) ABSTRACT

An ECC circuit (103) is located between I/O terminals (104₀-104₇) and page buffers (102₀-102₇). The ECC circuit (103) includes a coder configured to generate check bits (ECC) for error correcting and attach the check bits to data to be written into a plurality of memory cell areas (101₀-101₇), and a decoder configured to employ the generated check bits (ECC) for error correcting the data read out from the memory cell areas (101₀-101₇). The ECC circuit (103) allocates a set of 40 check bits (ECC) to an information bit length of 4224=528×8 to execute coding and decoding by parallel processing 8-bit data, where data of 528 bits is defined as a unit to be written into and read out from one memory cell area (101*j*).

12 Claims, 23 Drawing Sheets

U.S. PATENT DOCUMENTS

| | | | |
|---|---|---|---|
| 6,308,295 B1 * | 10/2001 | Sridharan et al. | 714/755 |
| 6,351,412 B1 * | 2/2002 | Nozoe et al. | 365/185.09 |
| 6,360,346 B1 | 3/2002 | Miyauchi et al. | 714/763 |
| 6,510,537 B1 * | 1/2003 | Lee | 714/763 |
| 6,594,169 B2 * | 7/2003 | Sakui | 365/51 |
| 6,594,794 B1 * | 7/2003 | De Marzi et al. | 714/784 |
| 6,611,938 B1 | 8/2003 | Tanaka et al. | 714/763 |
| 6,633,509 B2 * | 10/2003 | Scheuerlein et al. | 365/230.03 |
| 6,647,471 B2 | 11/2003 | March et al. | 711/154 |
| 6,651,212 B1 * | 11/2003 | Katayama et al. | 714/763 |
| 6,678,860 B1 * | 1/2004 | Lee | 714/763 |
| 6,732,322 B1 | 5/2004 | Miyauchi et al. | 714/784 |
| 6,735,726 B2 | 5/2004 | Muranaka et al. | 714/708 |
| 6,826,116 B2 | 11/2004 | Noda et al. | 365/238.5 |
| 6,862,662 B1 | 3/2005 | Cloud | 711/118 |
| 6,957,378 B2 * | 10/2005 | Koga et al. | 714/763 |
| 6,982,900 B2 | 1/2006 | Hirabayashi | |
| 7,051,264 B2 * | 5/2006 | Leung et al. | 714/763 |
| 7,076,722 B2 * | 7/2006 | Shibata | 714/763 |
| 7,184,351 B2 * | 2/2007 | Ito et al. | 365/222 |
| 7,225,390 B2 * | 5/2007 | Ito et al. | 714/777 |

FOREIGN PATENT DOCUMENTS

| | | |
|---|---|---|
| JP | 03119835 A | 5/1991 |
| JP | 04365139 A | 12/1992 |
| JP | 06276106 A | 9/1994 |
| JP | 07312560 A | 11/1995 |
| JP | 08167857 A | 6/1996 |
| JP | 09162753 A | 6/1997 |
| JP | 09180496 A | 7/1997 |
| JP | 10126280 A | 5/1998 |
| JP | 10334697 A | 12/1998 |
| JP | 11073797 A | 3/1999 |
| JP | 2000-348497 | 12/2000 |
| JP | 2001-014888 | 1/2001 |
| JP | 2005222618 A | 8/2005 |

OTHER PUBLICATIONS

Japanese language office action and its English translation for corresponding Japanese application 2006-126365 lists the references above.

U.S. Appl. No. 09/604,692.

Japanese language office actions and their English translations for corresponding Japanese application Nos. 2001-356571 and 2006-126365 list the references above.

* cited by examiner

Shift Register

XOR Circuit

IN1 ⊕ OUT
IN2

| IN1 | IN2 | OUT |
|-----|-----|-----|
| L | L | L |
| H | L | H |
| L | H | H |
| H | H | L |

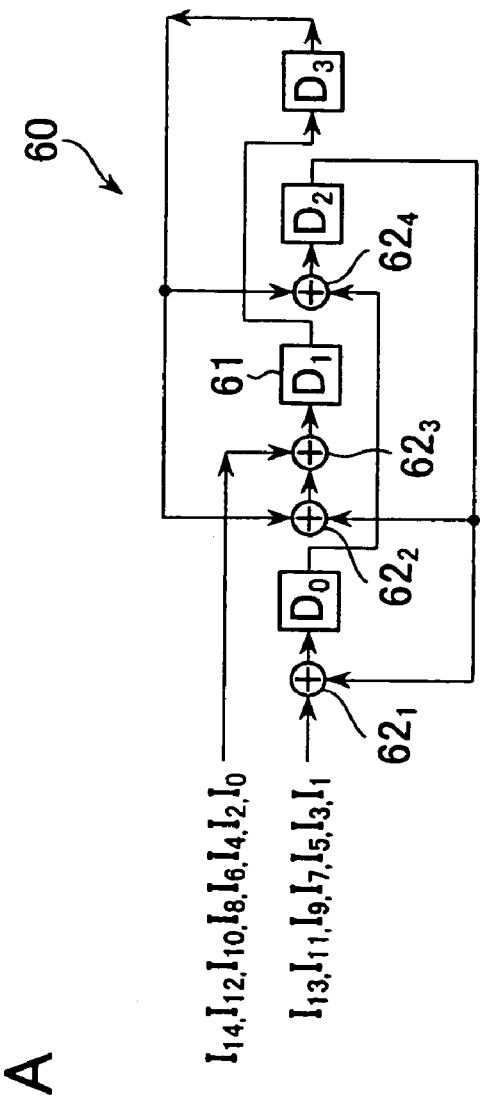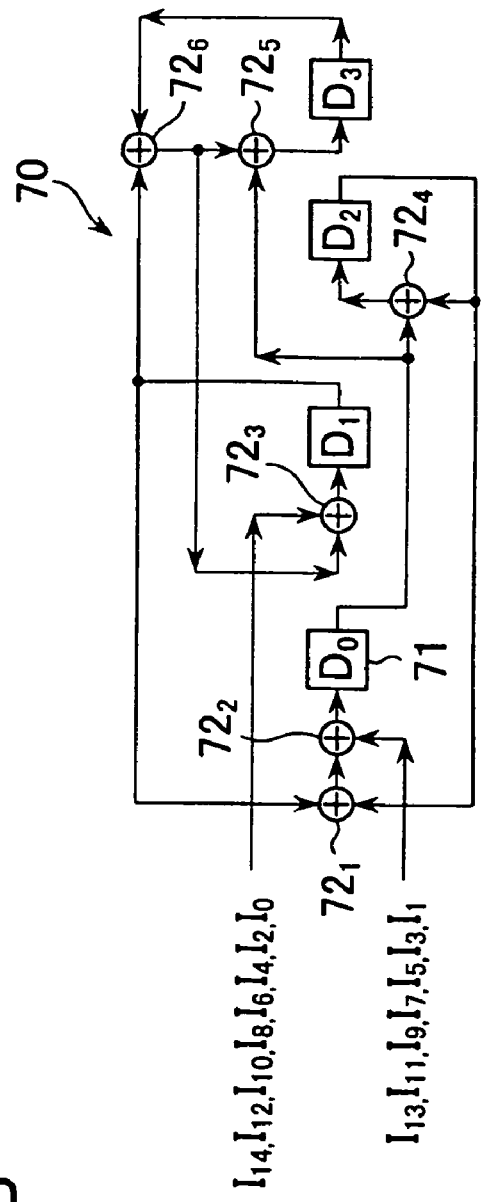
FIG. 4A
FIG. 4B

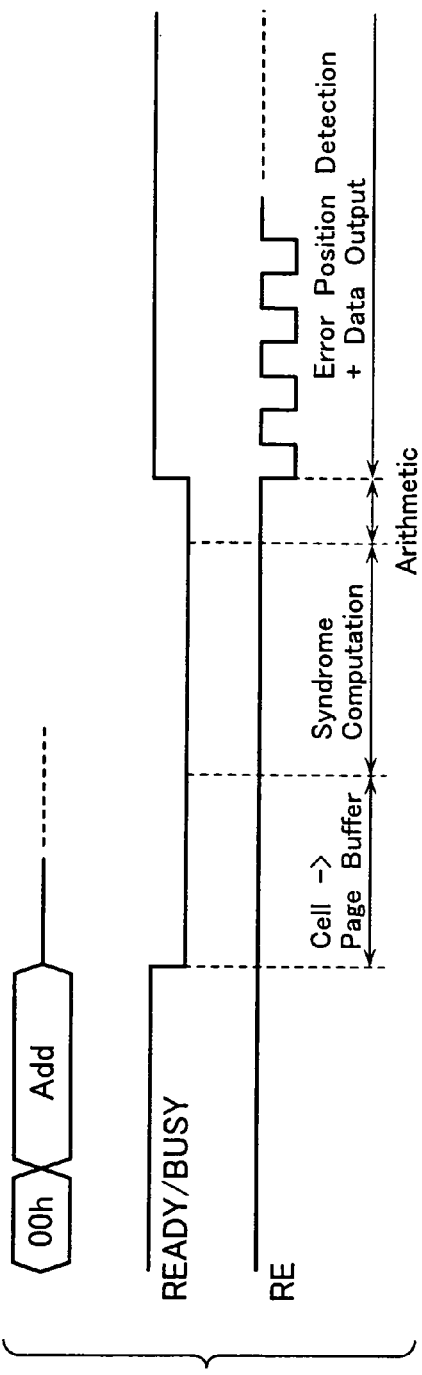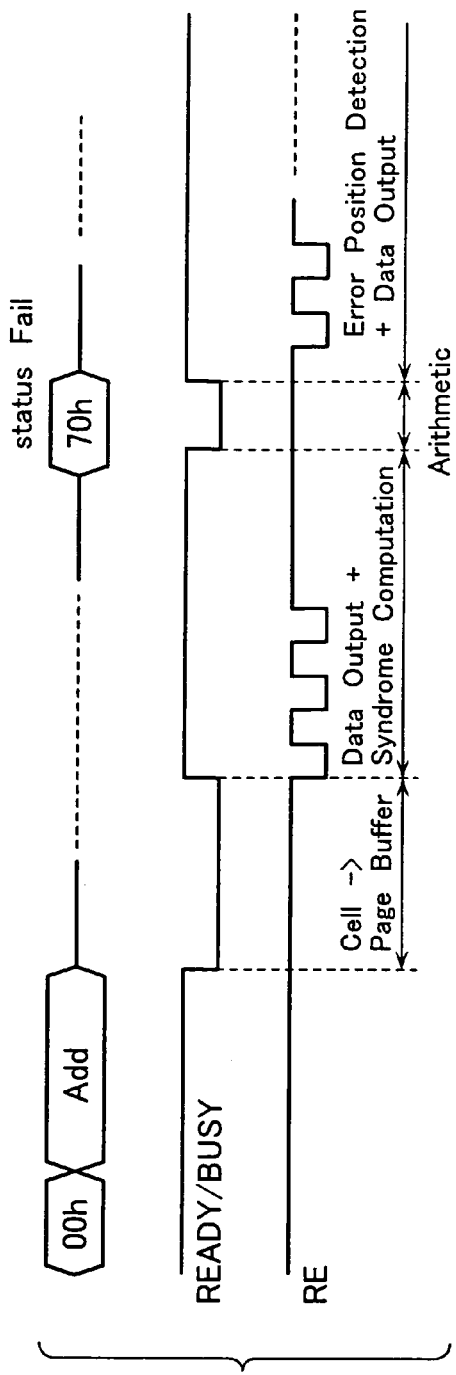
FIG. 20A
FIG. 20B

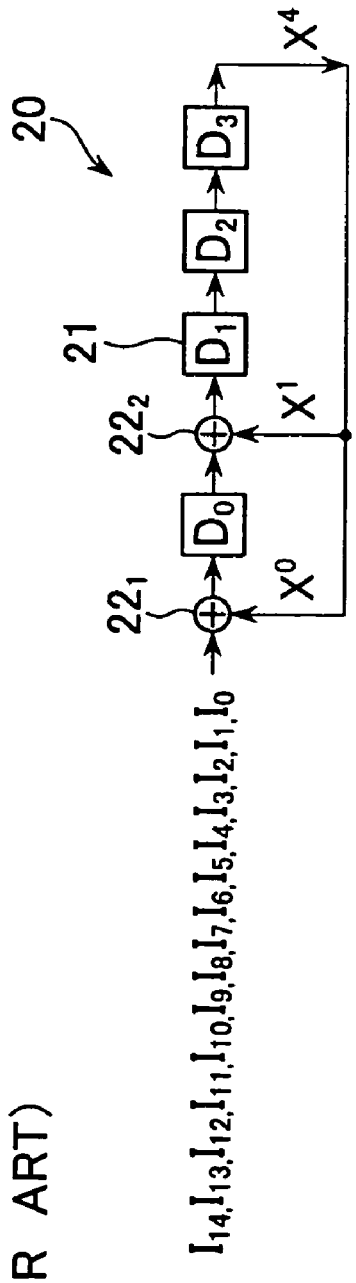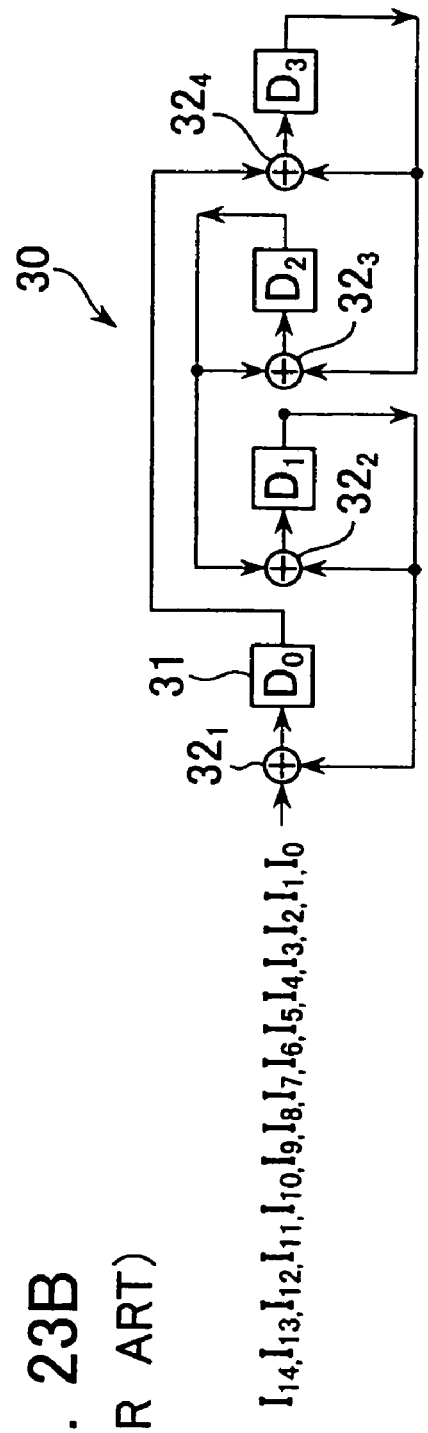
FIG. 23A (PRIOR ART)
FIG. 23B (PRIOR ART)

SEMICONDUCTOR MEMORY DEVICE

CROSS REFERENCE TO RELATED APPLICATION

This is a continuation of application Ser. No. 10/292,397 filed Nov. 12, 2002, now U.S. Pat. No. 7,076,722 the entire contents of which incorporated by reference. This application also claims benefit of priority under 35 U.S.C. § 119 to Japanese Patent Application No. 2001-356571 filed Nov. 21, 2001, the entire contents of which incorporated by reference.

BACKGROUND OF THE INVENTION

1. Field of the Invention

The present invention relates to a semiconductor memory device such as a NAND-type flash memory, more particularly to a semiconductor memory device having an on-chip error correcting function.

2. Description of the Related Art

The NAND-type flash memory is known to deteriorate its cell property through repeated operations of rewriting, and to vary data after it is left for a long time. In order to improve the reliability of the NAND-type flash memory, such a semiconductor memory that contains an ECC (Error Correcting Code) circuit mounted on-chip for error detection and correction has been proposed in the art (for example, Japanese Patent Application Laid-Open Nos. 2000-348497 and 2001-14888).

FIG. 21 is a block diagram briefly showing an arrangement of the conventional NAND-type flash memory with ECC circuits mounted thereon.

This memory comprises eight memory cell areas $1_0$, $1_1$, ..., $1_7$. Each of the memory cell areas $1_0$, $1_1$, ..., $1_7$ includes a plurality of memory cells, not depicted, arrayed in a matrix. Data of 528 bits (=one page) can be written in and read out from 528 memory cells connected to a common word line through 528 bit lines at a time. Page buffers $2_0$-$2_7$ are connected to the memory cell areas $1_0$-$1_7$, respectively. Each page buffer can hold 528-bit write data and read data. Between the page buffers $2_0$-$2_7$ and I/O terminals $4_0$-$4_7$ located corresponding to the memory cell areas $1_0$-$1_7$, ECC circuits $3_0$-$3_7$ are provided for the memory cell areas $1_0$-$1_7$, respectively.

Each ECC circuit $3_0$-$3_7$ has a coding function to add a certain bit number of check bits (ECC) to one page of information bits (528 bits) to be stored in each memory cell area $1_0$-$1_7$, and a decoding function to detect and correct a certain bit number of errors in the information bits with the check bits added thereto. BCH (Bose-Chaudhuri-Hocquenghem) code is employed as an error correcting code that can correct a plurality of bit errors with a relatively small circuit scale. Between the memory and external, data is read and written on a basis of 8 bits corresponding to the number of memory cells. Data is fed bit by bit into each ECC circuit $3_0$-$3_7$, and is circulated through and output from an internal cyclic shift register bit by bit to execute coding and decoding.

Operations of coding and decoding in the conventional ECC circuit $3_0$-$3_7$ using BCH code will be described next.

The number of check bits in BCH code for correcting 2-bit errors and detecting 3-bit errors is equal to 21 bits for 528 information bits. For convenience of description, a simple error detection and correction system is described, which employs BCH code capable of correcting 2-bit errors and detecting 3-bit errors for the number of information bits, k=7, a code length, n=15, and the number of check bits, t=2.

In this case, a generating polynomial required for coding and decoding is given below as it is generally known:

$$\text{Fundamental Polynomial: } F(X) = X^4 + X + 1 \quad (1)$$

$$\alpha \text{ Minimal Polynomial: } M_1(x) = X^4 + X + 1$$

$$\alpha^3 \text{ Minimal Polynomial: } M_3(x) = X^4 + X^3 + X^2 + X + 1$$

$$\text{Generating Polynomial: } G(x) = M_1 M_3$$
$$= X^8 + X^7 + X^6 + X^4 + 1$$

(1) Coder

FIG. 22 is a block diagram showing a coder 10 functionally configured inside the conventional ECC circuit $3i$ (i=0, 1, ..., or 7). The coder 10 comprises a shift register 11 consisting of registers $D_7$, $D_6$, $D_5$, $D_4$, $D_3$, $D_2$, $D_1$, $D_0$, XOR circuits $12_1$, $12_2$, $12_3$, $12_4$ for modulo-2 operations, and circuit changing switches SW1, SW2.

An operation for moving the shift register 11 once corresponds to multiplying each value in the shift register 11 by X. A value of data stored in the shift register 11 can be expressed by:

$$a_0X^0 + a_1X^1 + a_2X^2 + a_3X^3 + a_4X^4 + a_5X^5 + a_6X^6 + a_7X^7 \quad (2)$$

where $a_i$ denotes a value stored in a register $D_i$, and $a_i$=0 or 1 (i=0-7). When this is shifted once, the following is obtained:

$$a_0X^1 + a_1X^2 + a_2X^3 + a_3X^4 + a_4X^5 + a_5X^6 + a_6X^7 + a_7X^8 \quad (3)$$

From the generating polynomial G(x) given by Expression (1), a relation of $X^8 = X^7 + X^6 + X^4 + 1$ is derived. Therefore, Expression (3) can be represented by:

$$a_7X^0 + a_0X^1 + a_1X^2 + a_2X^3 + (a_3+a_7)X^4 + a_4X^5 + (a_5+a_7)X^6 + (a_6+a_7)X^7 \quad (4)$$

This corresponds to shifting each bit; storing the value $a_7$ of the register $D_7$ into the register $D_0$; adding the values $a_3$, $a_7$ of the registers $D_3$, $D_7$ at the XOR circuit $12_1$ and storing the sum into the register $D_4$; adding the values $a_5+a_7$ of the registers $D_5$, $D_7$ at the XOR circuit $12_2$ and storing the sum into the register $D_6$; and adding the values $a_6+a_7$ of the registers $D_6$, $D_7$ at the XOR circuit $12_3$ and storing the sum into the register $D_7$.

On coding, the switches SW1, SW2 are first connected to ON sides to enter input data (information bits) $I_0$, $I_1$, $I_2$, $I_3$, $I_4$, $I_5$, $I_6$ ($I_0$-$I_6$=0 or 1) bit by bit from external through the I/O terminal $4i$. Every time one bit of the input data $I_0$-$I_6$ enters, the shift register 11 operates once. As the switch SW1 is kept ON during the input data $I_0$-$I_6$ entering, the data is output bit by bit to the page buffer $2i$ as it is. At the same time, the input data $I_0$-$I_6$ is added to the value $a_7$ of the register $D_7$ at the XOR circuit $12_1$ and the sum is stored in turn into the shift register 11. After completion of the input data $I_0$-$I_6$ entered into the page buffer $2i$, check bits $I_7$, $I_8$, $I_9$, $I_{10}$, $I_{11}$, $I_{12}$, $I_{13}$, $I_{14}$ are stored inside the registers $D_7$, $D_6$, $D_5$, $D_4$, $D_3$, $D_2$, $D_1$, $D_0$ of the shift register 11, respectively. The switches SW1, SW2 are then connected to OFF sides and, every time the shift register 11 operates, the check bits $I_7$-$I_{14}$ are output serially to the page buffer $2i$ through the switch SW1. The information bits and check bits stored in the page buffer $2i$ are written into the memory cell area $1i$. At the same time, the value in the shift register 11 is reset.

(2) Decoder

A decoder is described next. The decoder comprises syndrome computational circuits and an error position detector. In the case of 2-bit error detection, two syndromes $S_1$, $S_3$ are required for decoding. These syndromes can be derived from the minimal polynomial $M_1(x)=X^4+X+1$ as it is known. FIG. 23 specifically shows (A) a conventional $S_1$ syndrome computational circuit 20 and (B) a conventional $S_3$ syndrome computational circuit 30.

Based on the minimal polynomial $M_1(x)$, the $S_1$ syndrome computational circuit 20 in FIG. 23A comprises a shift register 21 consisting of registers $D_3$, $D_2$, $D_1$, $D_0$, and XOR circuits $22_1$, $22_2$. An operation for moving the shift register 21 once corresponds to multiplying a value in the shift register 21 by X. The value stored in the shift register 21 can be expressed by:

$$a_0X^0+a_1X^1+a_2X^2+a_3X^3 \qquad (5)$$

where $a_i$ denotes a value stored in a register $D_i$, and $a_i=0$ or 1 (i=0-3). When this is shifted once, the following is obtained:

$$a_0X^1+a_1X^2+a_2X^3+a_3X^4 \qquad (6)$$

From the α minimal polynomial $M_1(x)$, a relation of $X^4=X+1$ is derived. Accordingly:

$$a_3X^0+(a_0+a_3)X^1+a_1X^2+a_2X^3 \qquad (7)$$

This corresponds to shifting each bit; storing the value $a_3$ of the register $D_3$ into the register $D_0$; and adding the values $a_0$, $a_3$ of the registers $D_0$, $D_3$ at the XOR circuit $12_2$ and storing the sum into the register $D_1$. The information bits $I_0$-$I_6$ and check bits $I_7$-$I_{14}$ are fed in this order into the $S_1$ syndrome computational circuit 20 bit by bit. The shift register 21 operates once every time one bit enters. After all bits $I_0$-$I_{14}$ enter, the syndrome $S_1$ is generated in the shift register 21 ($D_0$-$D_3$).

Similar to the $S_1$ syndrome computational circuit 20, the $S_3$ syndrome computational circuit 30 in FIG. 23B comprises a shift register 31 consisting of registers $D_3$, $D_2$, $D_1$, $D_0$, and XOR circuits $32_1$, $32_2$, $32_3$, $32_4$. It is configured by the $X^3$ circuit of the minimal polynomial $M_1(x)$. In the $S_3$ syndrome computational circuit 30, an operation for moving the shift register 31 once corresponds to multiplying a value in the shift register 31 by $X^3$. The value stored in the shift register 31 is expressed by Expression (5). When it is multiplied by $X^3$, the following is given:

$$a_0X^3+a_1X^4+a_2X^5+a_3X^6 \qquad (8)$$

From the α minimal polynomial $M_1(x)$, a relation of $X^4=X+1$ is derived. Accordingly:

$$a_1X^0+(a_1+a_2)X^1+(a_2+a_3)X^2+(a_0+a_3)X^3 \qquad (9)$$

This corresponds to shifting each bit; storing the value $a_1$ of the register $D_1$ into the register $D_0$; adding the values $a_1$, $a_2$ of the registers $D_1$, $D_2$ at the XOR circuit $32_2$ and storing the sum into the register $D_1$; adding the values $a_2$, $a_3$ of the registers $D_2$, $D_3$ at the XOR circuit $32_3$ and storing the sum into the register $D_2$; and adding the values $a_0$, $a_3$ of the registers $D_0$, $D_3$ at the XOR circuit $32_4$ and storing the sum into the register $D_3$. The information bits $I_0$-$I_6$ and check bits $I_7$-$I_{14}$ stored in the memory cells are also fed in this order into the $S_3$ syndrome computational circuit 30 bit by bit. The shift register 31 operates once every time one bit enters. After all bits $I_0$-$I_{14}$ enter, the syndrome $S_3$ is generated in the shift register 31 ($D_0$-$D_3$).

FIG. 24 is a flowchart showing an algorithm for decoding. The $S_1$, $S_3$ syndrome computational circuits 20, 30 compute syndromes $S_1$, $S_3$ first based on the information bits and check bits read out from the memory cell area 1$i$ (step S1). If the syndromes $S_1$, $S_3$ are S1=S3=0, it is determined errorless, and the read-out information bits are output as they are (steps S2, S3, S4). If only one of the syndromes $S_1$, $S_3$ is equal to 0, it is determined uncorrectable, and the data is output as it is (steps S2, S3, S5, S6, S7). If $S_1\ne0$ and $S_3\ne0$, computations are executed to derive $\sigma_1=S_1^2$ and $\sigma_2=S_1^3+S_3$ (steps S2, S6, S8). If $\sigma_2=0$ (step S9), it can be found that a 1-bit error is present, and 1-bit corrected data is output (step S10). If $\sigma_2\ne0$ (step S9), it can be found that 2-bit errors are present, and 2-bit corrected data is output (step S11).

The position of the error bit can be found by assigning $Z=\alpha^I$ (I=0, 1, 2, 3, 4, 5, 6) in turn to an error position polynomial σ(Z) represented by Expression (10) as it is known generally. The position of the error can be indicated by i that holds $\sigma(\alpha^I)=0$.

$$\sigma(Z)=S_1+\sigma_1\times Z+\sigma_2\times Z^2 \qquad (10)$$

An arrangement of the error position detector is shown in FIGS. 25 and 26, which is configured based on such the point. FIG. 25 shows a first arithmetic section 40$a$ that computes and stores $S_1$, σ and $\sigma_2$. FIG. 26 shows a second arithmetic section 40$b$ that executes the operation of Expression (10) based on the operated result from the first arithmetic section 40$a$ and outputs a detection signal to indicate the error position in the data. As shown in FIG. 25, the first arithmetic section 40$a$ comprises a shift register 41, an X arithmetic circuit 42, and an $X^2$ arithmetic circuit 43. A shift register 41$a$ stores the syndrome $S_1$, and shift registers 42$a$ and 43$a$ store the operated results, $\sigma_1=S_1^2$ and $\sigma_2=S_1^3+S_3$. It is assumed that the shift register 42$a$ has a value of:

$$a_0X^0+a_1X^1+a_2X^2+a_3X^3 \qquad (11)$$

where $a_i$ denotes a value stored in a register $D_i$, and $a_i=0$ or 1 (i=0-3). As the X arithmetic circuit 42 multiplies it by X, the value of the shift register 42$a$ comes to:

$$a_0X^1+a_1X^2+a_2X^3+a_3X^4 \qquad (12)$$

From the α minimal polynomial $M_1(x)$, a relation of $X^4=X+1$ is present. Accordingly, Expression (12) yields:

$$a_3X^0+(a_0+a_3)X^1+a_1X^2+a_2X^3 \qquad (13)$$

This corresponds to shifting each bit; storing the value $a_3$ of the register $D_3$ into the register $D_0$; and adding the values $a_0$, $a_3$ of the registers $D_0$, $D_3$ at the XOR circuit $42_2$ and storing the sum into the register $D_1$.

The $X^2$ arithmetic circuit 43 multiplies the value of the shift register 43$a$ by $X^2$. Therefore, when the value indicated by Expression (11) is stored in the shift register 43$a$, and it is multiplied by $X^2$, the value of the shift register 43$a$ comes to:

$$a_0X^2+a_1X^3+a_2X^4+a_3X^5 \qquad (14)$$

From the α minimal polynomial $M_1(x)$, a relation of $X^4=X+1$ is present. Accordingly, Expression (14) yields:

$$a_2X^0+(a_2+a_3)X^1+(a_0+a_3)X^2+a_1X^3 \qquad (15)$$

This corresponds to shifting each bit; storing the value $a_2$ of the register $E_2$ into the register $E_0$; storing the value $a_1$ of the register $E_1$ into the register $E_3$; adding the values $a_2$, $a_3$ of the registers $E_2$, $E_3$ at the XOR circuit $43b_1$ and storing the sum into the register $E_1$; and adding the values $a_0$, $a_3$ of the registers $E_0$, $E_3$ at the XOR circuit $43b_2$ and storing the sum into the register $E_2$.

When 1-bit data $I_0$-$I_6$ is output, one shift operation of the shift registers 41$a$, 42$a$, 43$a$ multiplies the term of $\sigma_1$ by Z in the X arithmetic section 42 and the term of $\sigma_2$ by $Z^2$ in the $X^2$ arithmetic section 43. The NAND-type flash memory operates the shift registers 41$a$, 42$a$, 43$a$ in synchronization with the toggle signal that is employed to output the information bits stored in the memory cell to outside the chip. In the second arithmetic circuit 40*b*, the result from the operation through an XOR circuit 44 and an NOR gate 45 exhibits '1' at the error position. This output is employed to invert the corresponding data Ii to detect and correct the error.

Thus, in the conventional ECC circuit that employs BCH code, one shift and computation per 1-bit input is the basic operation. The NAND-type flash memory receives parallel data input from external on a basis of 8-I/O or 16-I/O per address. Therefore, it is required to correct an error per I/O or compute 8 or 16 times during the one input. The 8 or 16-time computation during the one input needs a fast operation for this part, which can not be achieved practically because a special process is required, for example.

Therefore, an ECC circuit 3*i* is provided for each memory cell area 1*i* (each I/O) in the art to correct errors on a basis of each memory cell area 1*i*. The NAND-type flash memory reads and programs data per page (528 bytes). If it intends to correct 2-bit errors and detect 3-bit errors per I/O, it requires 21 check bits for 528 information bits, 21×8=168 extra check bits in total for the entire chip. This is an inhibit factor for improving the chip integration density.

The present invention has been made in consideration of such the problem and accordingly has an object to provide a semiconductor memory device capable of reducing the number of check bits relative to the number of information bits to improve a chip integration density.

BRIEF SUMMARY OF THE INVENTION

According to an aspect of the invention, a semiconductor memory device comprises a plurality of memory cell areas, each of which includes a plurality of memory cells arrayed in a matrix and has a data I/O portion; a plurality of buffers, each of which is located on the data I/O portion at each memory cell area to temporarily store data to be written into the memory cell area and data read out from the memory cell area; a plurality of I/O terminals, each of which is configured to receive the data to be written into the memory cell area from external and output the data read out from the memory cell area to external; and an error correction circuit located between the plurality of I/O terminals and the plurality of buffers, the error correction circuit includes a coder configured to generate check bits for error correcting and to attach the check bits to the data to be written into the memory cell area and a decoder configured to process for error correcting the data read out from the memory cell area with the generated check bits, the error correction circuit operates to allocate a set of check bits to an information bit length of M×N (N denotes an integer of two or more) to execute at least one of coding and decoding by parallel processing N-bit data, where M denotes the number of bits in a unit of data to be written into and read out from the memory cell area.

BRIEF DESCRIPTION OF THE DRAWINGS

The present invention will be more fully understood from the following detailed description with reference to the accompanying drawings, in which:

FIGS. 4A and 4B are block diagrams showing syndrome computational circuits in a decoder for use in the ECC circuit;

FIGS. 20A and 20B are timing charts on decoding in the ECC circuit;

FIGS. 23A and 23B are block diagrams showing conventional syndrome computational circuits;

DETAILED DESCRIPTION OF THE INVENTION

Embodiments of the present invention will be described below with reference to the drawings.

(1) First Embodiment

In order to provide an understanding of the present invention, 2-bit error correction is exemplified as a first embodiment with the number of information bits, k=7, a code length, n=15, and the number of correction bits, t=2.

(1-1) Coder

Figure 22:
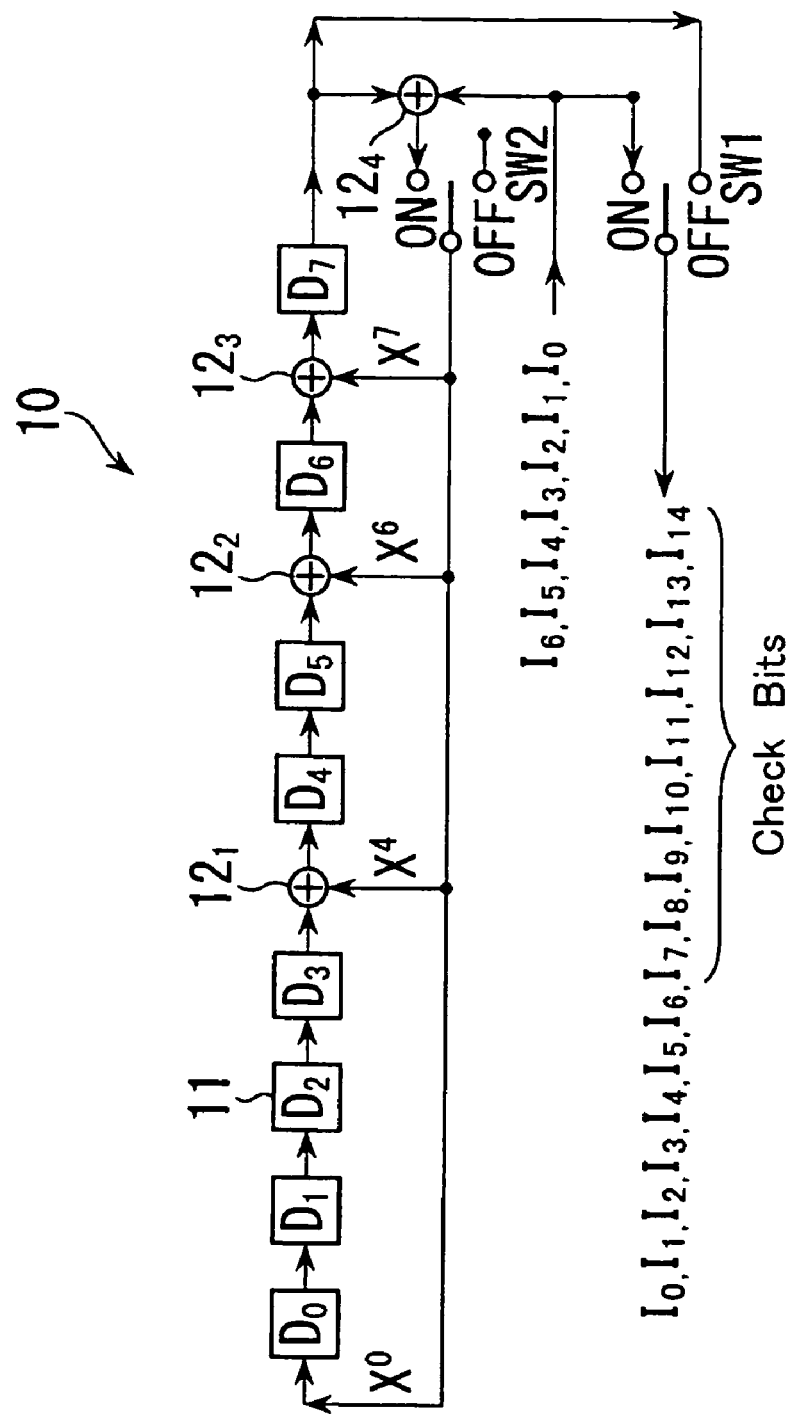
FIG. 22 is a block diagram showing a coder in the conventional ECC circuit.
Figure 24:
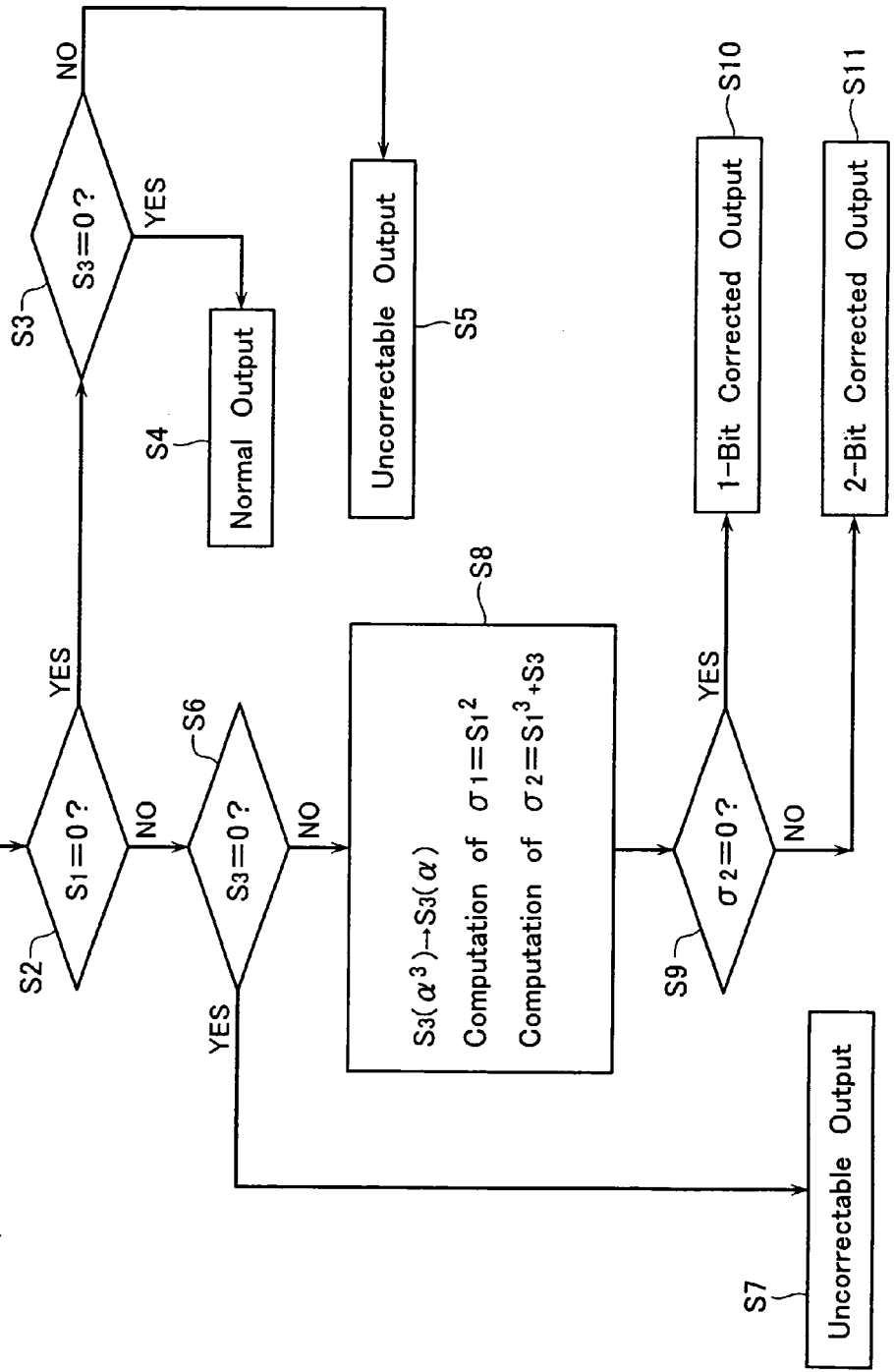
FIG. 24 is a flowchart showing a decoding algorithm in the conventional ECC circuit.

When input data $I_0$ enters the conventional coder 11 shown in FIG. 22, the input data $I_0$ is added at the XOR circuit 12$_4$ to the term of $X^7$ in the coder, then multiplied by X. Each register 11 in the coder 10 in the initial state has a value of 0, which is referred to as (0). Accordingly:

$$(0+I_0X^7)X \tag{17}$$

When next input data $I_1$ enters the coder 10, the input data $I_1$ is added to the term of $X^7$ in the coder 10, then multiplied by X to yield:

$$((0+I_0X^7)X+I_1X^7)X \qquad (18)$$

When next input data $I_2$ enters the coder 10, the input data $I_2$ is added to the term of $X^7$ in the coder 10, then multiplied by X to yield:

$$(((0+I_0X^7)X+I_1X^7)X+I_2X^7)X \qquad (19)$$

Similarly, after input data, up to $I_6$, enters the coder 10, the following is given:

$$(((((((0+I_0X^7)X+I_1X^7)X+I_2X^7)X+I_3X^7)X+I_4X^7)X+I_5X^7)X+I_6X^7)X \qquad (20)$$

This expression can be altered in:

$$(((((0+I_0X^7)X+I_1X^6)X^2+I_2X^7)X+I_3X^6)X^2+I_4X^7)X^2+I_5X^6)X^2+I_6X^7)X \qquad (21)$$

This means that the pieces of input data $I_0$, $I_1$ are added to the terms of $X^7$, $X^6$ in the coder 10, respectively, then multiplied by $X^2$. Thereafter, the pieces of input data $I_2$, $I_3$ are added to the terms of $X^7$, $X^6$ in the coder 10, respectively, then multiplied by $X^2$. Finally the pieces of input data $I_4$, $I_5$ are added to the terms of $X^7$, $X^6$ in the coder 10, respectively, then multiplied by $X^2$. In a word, one operation of the shift register 11 after two bits input can multiply the data by $X^2$. As for the last data $I_6$, however, one bit input multiplies it by X as is in the art.

When the value of the shift register 11 represented by Expression (2) is multiplied by $X^2$, it comes to:

$$a_0X^2+a_1X^3+a_2X^4+a_3X^5+a_4X^6+a_5X^7+a_6X^8+a_7X^9 \qquad (22)$$

From the generating polynomial $G(x)$ given by Expression (1), a relation of $X^8=X^7+X^6+X^4+1$ is derived. Therefore, Expression (21) yields:

$$(a_6+a_7)X^0+a_7X^1+a_0X^2+a_1X^3+(a_2+a_6+a_7)X^4+(a_3+a_7)X^5+(a_4+a_6+a_7)X^6+(a_5+a_6)X^7 \qquad (23)$$

Figure 1:
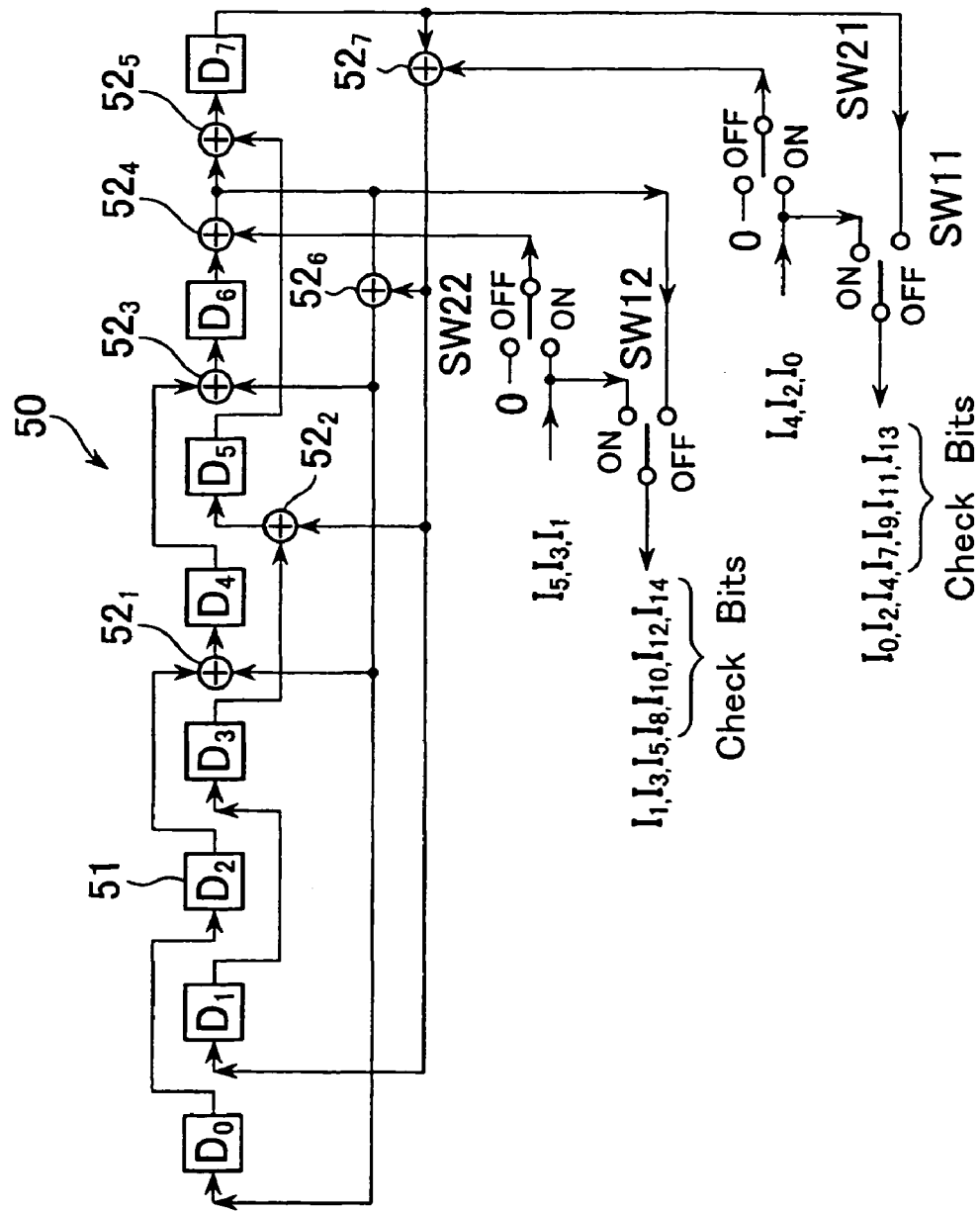
FIG. 1 is a block diagram showing an arrangement of a coder for use in an ECC circuit mounted on a flash memory according to a first embodiment of the present invention.

FIG. 1 is a block diagram showing a circuit arrangement of a coder 50 according to the present embodiment that specifically configures Expression (23).

Figures 2, 3:
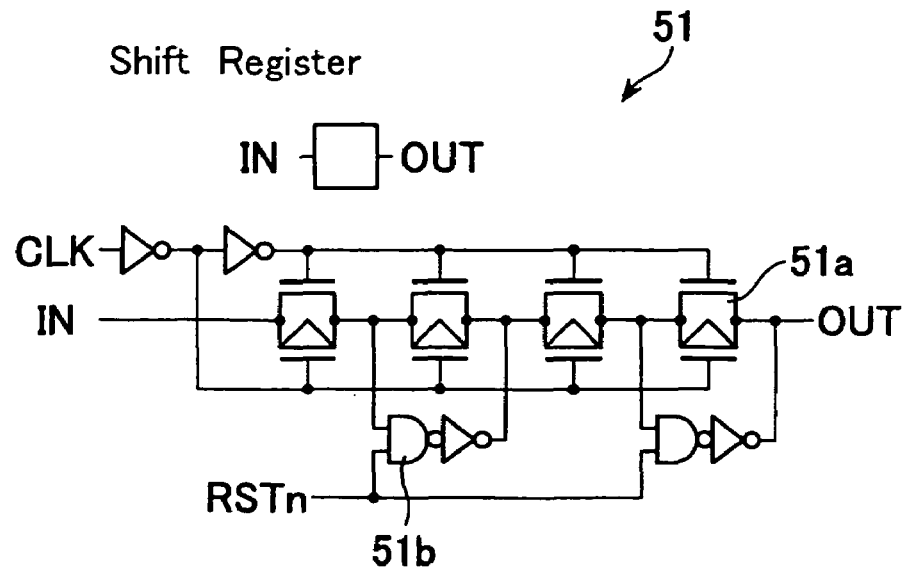
FIG. 2 is a block diagram showing an arrangement of a shift register for use in the coder.
FIG. 3 is a truth table of an XOR circuit for use in the coder.

The coder 50 comprises a shift register 51 consisting of registers $D_7$, $D_6$, $D_5$, $D_4$, $D_3$, $D_2$, $D_1$, $D_0$, XOR circuits $52_1$, $52_2$, $52_3$, $52_4$, $52_5$, $52_6$, $52_7$, and four switches SW11, SW12, SW21, SW22 for changing input data and output data. The shift register 51 includes four-stage transfer gates 51$a$ and other necessary gate circuits 51$b$ as shown in FIG. 2. In the transfer gates 51$a$, a reset signal RSTn is employed to reset the contents of data and a clock signal CLK to synchronously transfer 1-bit data from an input terminal IN to an output terminal OUT. An XOR circuit 52 applies a modulo-2 operation to data input from input terminals IN1, IN2, as shown in FIG. 3, and output the result from an output terminal OUT.

Based on Expression (23), the coder 50 through one shift operation performs: adding the values $a_6$, $a_7$ of the registers $D_6$, $D_7$ at the XOR gate $52_6$ and storing the sum into the register $D_0$; storing the value $a_7$ of the register $D_7$ into the register $D_1$; storing the value $a_0$ of the register $D_0$ into the register $D_2$; storing the value $a_1$ of the register $D_1$ into the register $D_3$; adding the values $a_2$, $a_6$, $a_7$ of the registers $D_2$, $D_6$, $D_7$ at the XOR gates $52_1$, $52_6$ and storing the sum into the register $D_4$; adding the values $a_3$, $a_7$ of the registers $D_3$, $D_7$ at the XOR gate $52_2$ and storing the sum into the register $D_5$; adding the values $a_4$, $a_6$, $a_7$ of the registers $D_4$, $D_6$, $D_7$ at the XOR gates $52_3$, $52_6$ and storing the sum into the register $D_6$; and adding the values $a_5$, $a_6$ of the registers $D_5$, $D_6$ at the XOR gate $52_5$ and storing the sum into the register $D_7$.

The pieces of input data (information bits) $I_0$, $I_1$, $I_2$, $I_3$, $I_4$, $I_5$, $I_6$, given from external to be written into the memory, are divided into two: input data $I_0$, $I_2$, $I_4$ and input data $I_1$, $I_3$, $I_5$. The input data $I_0$, $I_2$, $I_4$ is fed to ON sides of the switches SW11, SW21. The input data $I_1$, $I_3$, $I_5$ is fed to ON sides of the switches SW12, SW22. The pieces of input data are fed by two bits in parallel in an order of ($I_0$, $I_1$), ($I_2$, $I_3$), ($I_4$, $I_5$). After the input, the shift register 51 operates once. As the shift register 51 is connected to every other one, one shift operation multiplies the data by $X^2$. While the pieces of data ($I_0$, $I_1$), ($I_2$, $I_3$), ($I_4$, $I_5$) enter, the switches SW11, SW12, SW21, SW22 are all kept ON to allow these pieces of data to output by two bits in parallel as they are. At the same time, the data $I_0$, $I_2$, $I_4$ is added to the value $a_7$ of the register $D_7$ at the XOR circuit $52_7$ and sequentially stored in the shift register 51. The data $I_1$, $I_3$, $I_5$ is added to the value $a_7$ of the register $D_7$ at the XOR circuit $52_4$ and sequentially stored in the shift register 51. As the last $I_6$ of the input data is 1-bit input, the connection is switched to the same as in the conventional coder 10 shown in FIG. 22. Such the switching is required because k=7 is selected as the number of information bits. After completion of input of the data $I_0$, $I_1$, $I_2$, $I_3$, $I_4$, $I_5$, $I_6$, check bits $I_7$, $I_8$, $I_9$, $I_{10}$, $I_{11}$, $I_{12}$, $I_{13}$, $I_{14}$ are stored inside the registers $D_7$, $D_6$, $D_5$, $D_4$, $D_3$, $D_2$, $D_1$, $D_0$ in the shift register 51, respectively. The switches SW11, SW12, SW21, SW22 are then all connected to OFF sides. Thus, every time the shift register 51 operates, the check bits $I_7$, $I_9$, $I_{11}$, $I_{13}$ are fed to the output of the switch SW11 and the check bits $I_8$, $I_{10}$, $I_{12}$, $I_{14}$ to the output of the switch SW12. At the same time, the value in the shift register 51 is reset. This allows check bits to be generated through 2-bit input parallel processing.

(1-2) Decoder

① $S_1$ Syndrome Computational Circuit

In the conventional $S_1$ syndrome computational circuit 20 of FIG. 23A, the value in the $S_1$ syndrome computational circuit 20 is first multiplied by X, then the input data $I_0$ is added to the term of $X^0$ at the XOR circuit $22_1$. The shift register 21 in the $S_1$ syndrome computational circuit 20 in the initial state has a value of 0, which is referred to as (0). Accordingly:

$$0 \times X + I_0 \qquad (24)$$

After the value in the $S_1$ syndrome computational circuit 20 is multiplied by X, the input data $I_1$ is added to the term of $X_0$. Accordingly:

$$(0 \times X + I_0)X + I_1 \qquad (25)$$

Subsequently, after the value in the $S_1$ syndrome computational circuit 20 is multiplied by X, the input data $I_2$ is added to the term of $X^0$. Accordingly:

$$((0 \times X + I_0)X + I_1)X + I_2 \qquad (26)$$

When the input data, up to $I_{14}$, enters the $S_1$ syndrome computational circuit 20, the following is given:

$$((((((((((((((0 \times X+I_0)X+I_1)X+I_2)X+I_3)X+I_4)X+I_5)X+I_6)X+I_7)X+I_8)X+I_9)X+I_{10})X+I_{11})X+I_{12})X+I_{13})X+I_{14} \qquad (27)$$

The expression can be altered in:

$$(((((((0 \times X^2+I_0X+I_1)X^2+I_2X+I_3)X^2+I_4X+I_5)X^2+I_6X+I_7)X^2+I_8X+I_9)X^2+I_{10}X+I_{11})X^2+I_{12}X+I_{13})X+I_{14} \qquad (28)$$

This means that after the value in the $S_1$ syndrome computational circuit 20 is multiplied by $X^2$, the input data $I_0$ is added to the term of $X^1$, and the input data $I_1$ to the term of $X^0$. Then, after the value in the $S_1$ syndrome computational circuit 20 is multiplied by $X^2$, the input data $I_2$ is added to the term of $X^1$, and the input data $I_3$ to the term of $X^0$. Next, after the value in the $S_1$ syndrome computational circuit 20 is multiplied by $X^2$, the input data $I_4$ is added to the term of $X^1$, and the input data $I_5$ to the term of $X^0$. In a word, one operation of the shift register multiplies the data by $X^2$, then 2-bit data enters. Finally, after the value in the $S_1$ syndrome computational circuit 20 is multiplied by X, the input data $I_{14}$ is added to the term of $X_0$ by 1-bit input.

When the value of the shift register 21, expressed by Expression (5), is multiplied by $X^2$, the following is given:

$$a_0 X^2 + a_1 X^3 + a_2 X^4 + a_3 X^5 \quad (29)$$

From, the $\alpha$ minimal polynomial $M_1(x)$, a relation of $X^4 = X+1$ is derived. Accordingly:

$$a_2 X^0 + (a_2+a_3) X^1 + (a_0+a_3) X^2 + a_1 X^3 \quad (30)$$

FIG. 4A is a block diagram showing a circuit arrangement of an $S_1$ syndrome computational circuit 60 according to the present embodiment that specifically configures Expression (30).

The $S_1$ syndrome computational circuit 60 comprises a shift register 61 consisting of registers $D_0$, $D_1$, $D_2$, $D_3$, and XOR circuits $62_1$, $62_2$, $62_3$, $62_4$.

Based on Expression (30), the $S_1$ syndrome computational circuit 60 through one shift operation performs: storing the value $a_2$ of the register $D_2$ into the register $D_0$; adding the values $a_2$, $a_3$ of the registers $D_2$, $D_3$ at the XOR circuit $62_2$ and storing the sum into the register $D_1$; adding the values $a_0$, $a_3$ of the registers $D_0$, $D_3$ at the XOR circuit $62_4$ and storing the sum into the register $D_2$; and storing the value $a_1$ of the register $D_1$ into the register $D_3$.

The information bits $I_0$, $I_1$, $I_2$, $I_3$, $I_4$, $I_5$, $I_6$ and check bits $I_7$, $I_8$, $I_9$, $I_{10}$, $I_{11}$, $I_{12}$, $I_{13}$, $I_{14}$ read out from the memory cell area, not depicted, are divided into $I_0$, $I_2$, $I_4$, $I_6$, $I_8$, $I_{10}$, $I_{12}$, $I_{14}$ and $I_1$, $I_3$, $I_5$, $I_7$, $I_9$, $I_{11}$, $I_{13}$ and fed by two bits in parallel in an order of $(I_0, I_1)$, $(I_2, I_3)$, $(I_4, I_5)$, ... to the $S_1$ syndrome computational circuit 60. After the input, the shift register 61 operates once. As the shift register 61 is connected to every other one, one shift operation multiplies the data by $X^2$. The data $I_0$, $I_2$, $I_4$, ..., $I_{14}$ is added at the XOR circuit $62_3$ to the output, $a_2+a_3$, from the XOR circuit $62_2$ and the sum is stored in the register $D_1$. The data $I_1$, $I_3$, $I_5$, ..., $I_{13}$ is added at the XOR circuit $62_1$ to the value $a_2$ of the register $D_2$ and the sum is stored in the register $D_0$. As the last $I_6$ of the information bits is 1-bit input, the connection is switched to the same as in the circuit of FIG. 23. Alternatively, it is possible to input $I_{15}=0$ to the $S_1$ syndrome computational circuit 60 and, after a shift operation, multiply the shift register by $X^{-1}$. This allows 2-bit input parallel processing to be performed.

②$S_3$ Syndrome Computational Circuit

A $S_3$ syndrome computational circuit 70 in FIG. 4B is described next. In the conventional $S_3$ syndrome computational circuit 30 in FIG. 23A, the value in the $S_3$ syndrome computational circuit 30 is first multiplied by $X^3$, then the input data $I_0$ is added to the term of $X_0$ at the XOR circuit $32_1$. The shift register 31 in the $S_3$ syndrome computational circuit 30 in the initial state has a value of 0, which is referred to as (0). Accordingly:

$$0 \times X^3 + I_0 \quad (31)$$

After the value in the $S_3$ syndrome computational circuit 30 is multiplied by $X^3$, the input data $I_1$ is added to the term of $X_0$. Accordingly:

$$(0 \times X^3 + I_0) X + I_1 \quad (32)$$

Subsequently, after the value in the $S_3$ syndrome computational circuit 30 is multiplied by $X^3$, the input data $I_2$ is added to the term of $X_0$. Accordingly:

$$((0 \times X^3 + I_0) X^3 + I_1) X^3 + I_2 \quad (33)$$

When the input data, up to $I_{14}$, enters the $S_3$ syndrome computational circuit 30, the following is given:

$$(((((0 \times X^3 + I_0) X^3 + I_1) X^3 + I_2) X^3 + I_3) X^3 + I_4) X^3 + I_5) X^3 + I_6) \\ X^3 + I_7) X^3 + I_8) X^3 + I_9) X^3 + I_{10}) X^3 + I_{11}) X^3 + I_{12}) X^3 + \\ I_{13}) X^3 + I_{14} \quad (34)$$

The expression can be altered in:

$$(((((0 \times X^6 + I_0 X^3 + I_1) X^6 + I_2 X^3 + I_3) X^6 + I_4 X^3 + I_5) X^6 + \\ I_6 X^3 + I_7) X^6 + I_8 X^3 + I_9) X^6 + I_{10} X^3 + I_{11}) X^6 + I_{12} X^3 + \\ I_{13}) X^3 + I_{14} \quad (35)$$

This means that after the value in the $S_3$ syndrome computational circuit 30 is multiplied by $X^6$, the input data $I_0$ is added to the term of $X^3$, and the input data $I_1$ to the term of $X^0$. Then, after the value in the $S_3$ syndrome computational circuit 30 is multiplied by $X^6$, the input data $I_2$ is added to the term of $X^3$, and the input data $I_3$ to the term of $X^0$. Next, after the value in the $S_3$ syndrome computational circuit 30 is multiplied by $X^6$, the input data $I_4$ is added to the term of $X^3$, and the input data $I_5$ to the term of $X^0$. In a word, one operation of the shift register multiplies the data by $X^6$, then 2-bit data is input. Finally, after the value in the $S_3$ syndrome computational circuit 30 is multiplied by $X^3$, the input data $I_{14}$ is added to the term of $X_0$ by 1-bit input.

When the value of the shift register 31, expressed by Expression (5), is multiplied by $X^6$, the following is given:

$$a_0 X^6 + a_1 X^7 + a_2 X^8 + a_3 X^9 \quad (36)$$

From the $\alpha$ minimal polynomial $M_1(x)$, a relation of $X^4 = X+1$ is derived. Accordingly:

$$(a_1+a_2) X^0 + (a_1+a_3) X^1 + (a_0+a_2) X^2 + (a_0+a_1+a_3) X^3 \quad (37)$$

FIG. 4B is a block diagram showing a circuit arrangement of the $S_3$ syndrome computational circuit 70 according to the present embodiment that specifically configures Expression (37).

The $S_3$ syndrome computational circuit 70 comprises a shift register 71 consisting of registers $D_0$, $D_1$, $D_2$, $D_3$, and XOR circuits $72_1$, $72_2$, $72_3$, $72_4$, $72_5$, $72_6$.

Based on Expression (37), the $S_3$ syndrome computational circuit 70 through one shift operation performs: adding the values $a_1$, $a_2$ of the registers $D_1$, $D_2$ at the XOR circuit $72_2$ and storing the sum into the register $D_0$; adding the values $a_1$, $a_3$ of the registers $D_1$, $D_3$ at the XOR circuit $72_6$ and storing the sum into the register $D_1$; adding the values $a_0$, $a_2$ of the registers $D_0$, $D_2$ at the XOR circuit $72_4$ and storing the sum into the register $D_2$; and adding the values $a_0$, $a_1$, $a_3$ of the registers $D_0$, $D_1$, $D_3$ at the XOR circuits $72_5$, $72_6$ and storing the sum into the register $D_3$.

The information bits $I_0$, $I_1$, $I_2$, $I_3$, $I_4$, $I_5$, $I_6$ and check bits $I_7$, $I_8$, $I_9$, $I_{10}$, $I_{11}$, $I_{12}$, $I_{13}$, $I_{14}$ read out from the memory cell area, not depicted, are divided into $I_0$, $I_2$, $I_4$, $I_6$, $I_8$, $I_{10}$, $I_{12}$, $I_{14}$ and $I_1$, $I_3$, $I_5$, $I_7$, $I_9$, $I_{11}$, $I_{13}$ and fed by two bits in parallel in an order of $(I_0, I_1)$, $(I_2, I_3)$, $(I_4, I_5)$, ... to the $S_3$ syndrome computational circuit 70. After the input, the shift register 71 operates once. The data $I_0$, $I_2$, $I_4$, ..., $I_{14}$ is added at the XOR circuit $72_3$ to the output, $a_1+a_3$, from the XOR circuit $72_6$ and the sum is stored in the register $D_1$. The data $I_1, I_3, I_5, \ldots, I_{13}$ is added to the output, $a_1+a_2$, from the XOR circuit $72_1$ at the XOR circuit $72_2$ and the sum is stored in the register $D_0$. As the last $I_6$ of the information bits is 1-bit input, the connection is switched to the same as in the $S_3$ syndrome computational circuit 30 of FIG. 23. Alternatively, it is possible to input $I_{15}=0$ to the $S_3$ syndrome computational circuit 70 and, after a shift operation, multiply the shift register by $X^{-3}$. This allows 2-bit input parallel processing to be performed.

③ Error Position Detector

An error position detector is described next. In the error position detector in the present embodiment, the $S_1$, $S_3$ syndrome computational circuits 60, 70 perform one shift operation corresponding to the conventional two shift operations. Therefore, the error position detector performs an arithmetic also corresponding to the conventional two shift operations. The error position polynomial (10) is also represented by:

$$\sigma(Z)=S_1+\sigma_1 \times Z^2+\sigma_2 \times Z^4 \tag{38}$$

Figure 5:
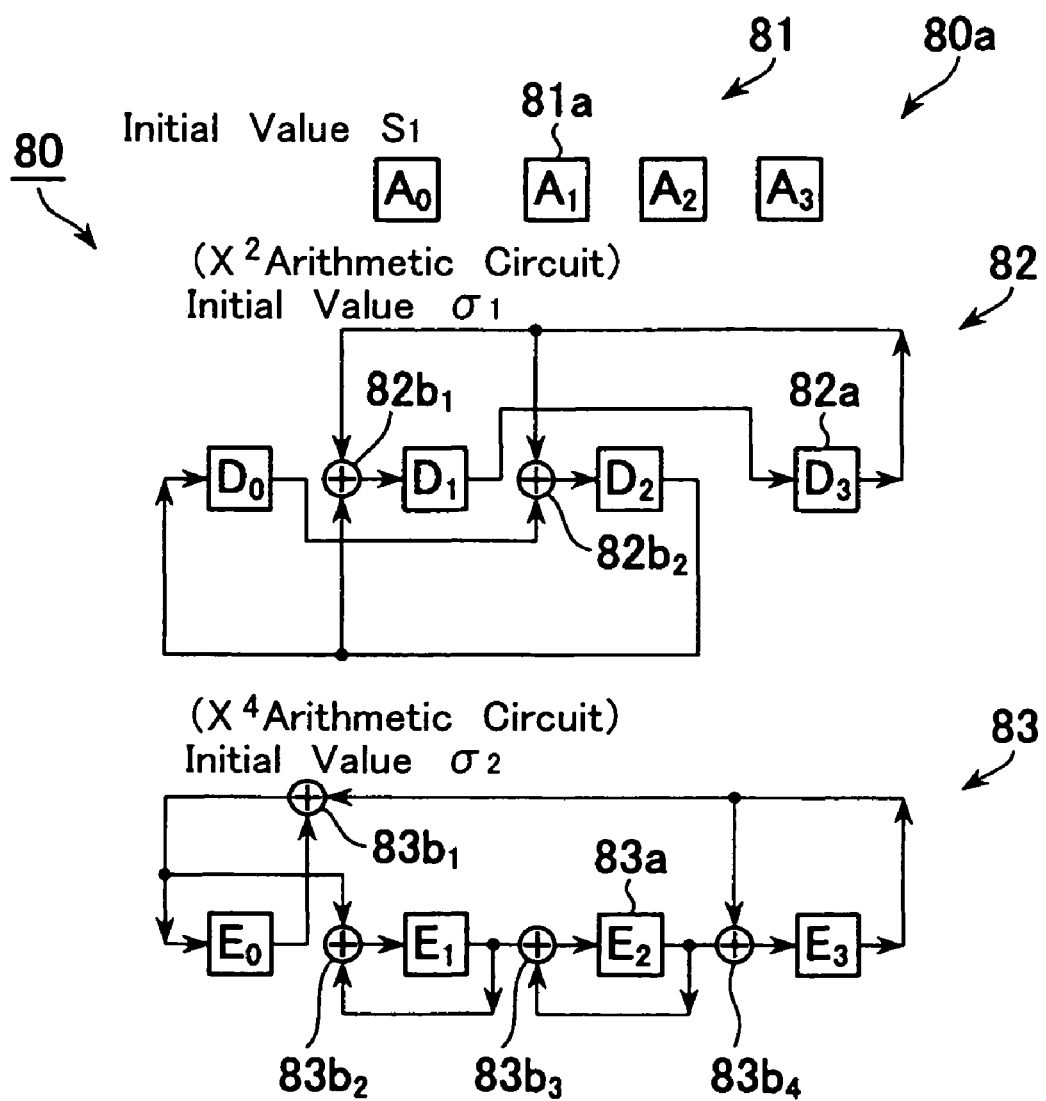
FIG. 5 is a block diagram showing a first arithmetic section contained in an error position detector for use in the decoder.
Figure 6:
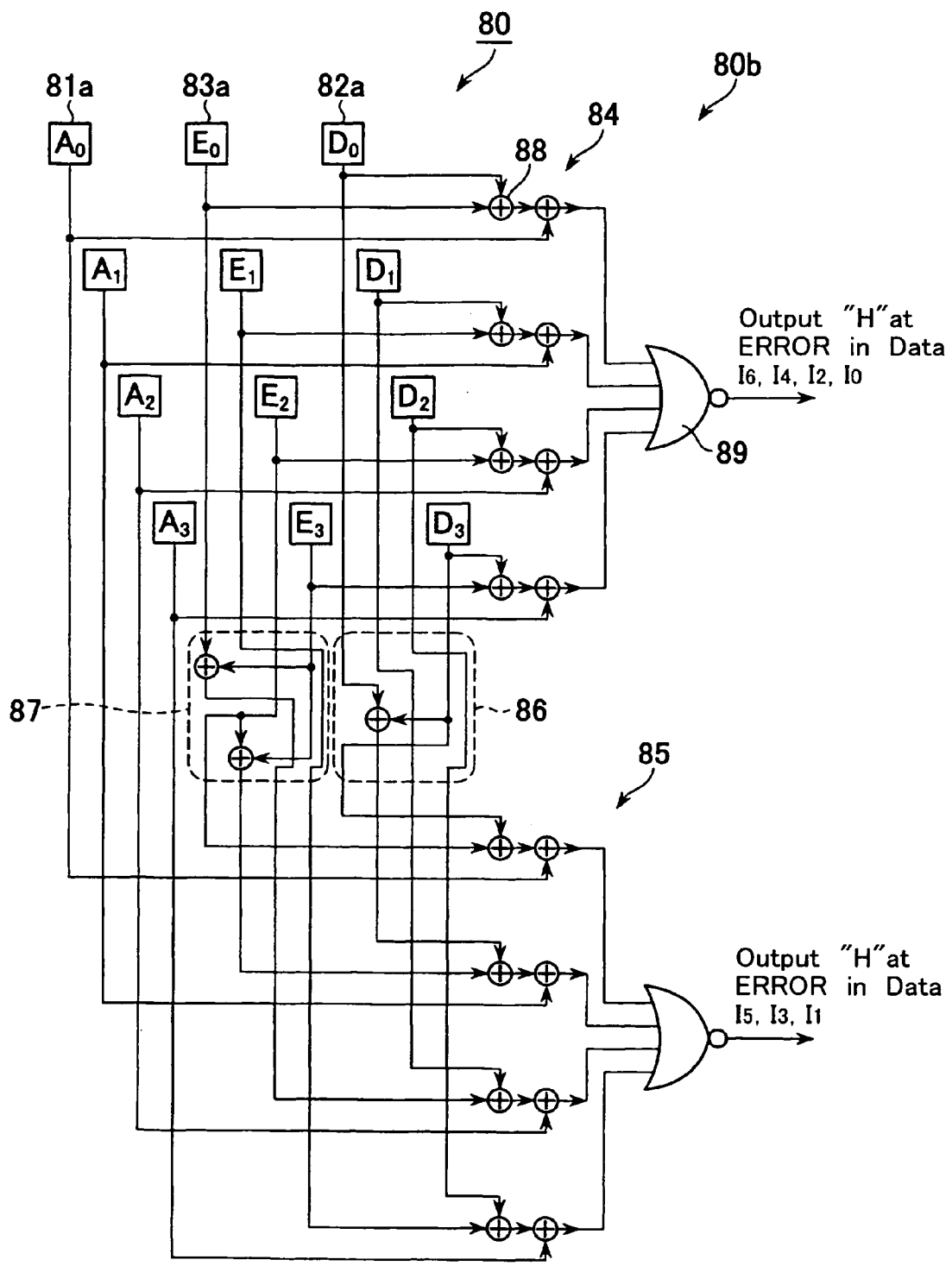
FIG. 6 is a block diagram showing a second arithmetic section contained in the error position detector.

FIGS. 5 and 6 show an arrangement of the error position detector configured based on Expression (38).

The error position detector 80 comprises a first arithmetic section 80a (FIG. 5) that computes and stores $S_1$, $\sigma_1$ and $\sigma_2$, and a second arithmetic section 80b that detects a data error position based on Expression (38) and outputs a detection signal. As shown in FIG. 5, the first arithmetic section 80a comprises a shift register 81, an $X^2$ arithmetic circuit 82, and an $X^4$ arithmetic circuit 83. A shift register 81a stores the syndrome $S_1$ as the initial state, and shift registers 82a, 83a store the operated results, $\sigma_1=S_1^2$ and $\sigma=S_1^3+S_3$, as the initial states. The error position detector 80 executes error detection in synchronization with every other data $I_0, I_2, I_4, I_6$ among the output data $I_0, I_1, I_2, I_3, I_4, I_5, I_6$. It operates the shift registers 81a, 82a, 83a once to multiply the term of $\sigma_1$ by $Z^2$ in the $X^2$ arithmetic circuit 82, and the term of $\sigma_2$ by $Z^4$ in the $X^4$ arithmetic circuit 83. If any error is present, then $\sigma=0$.

Figure 25:
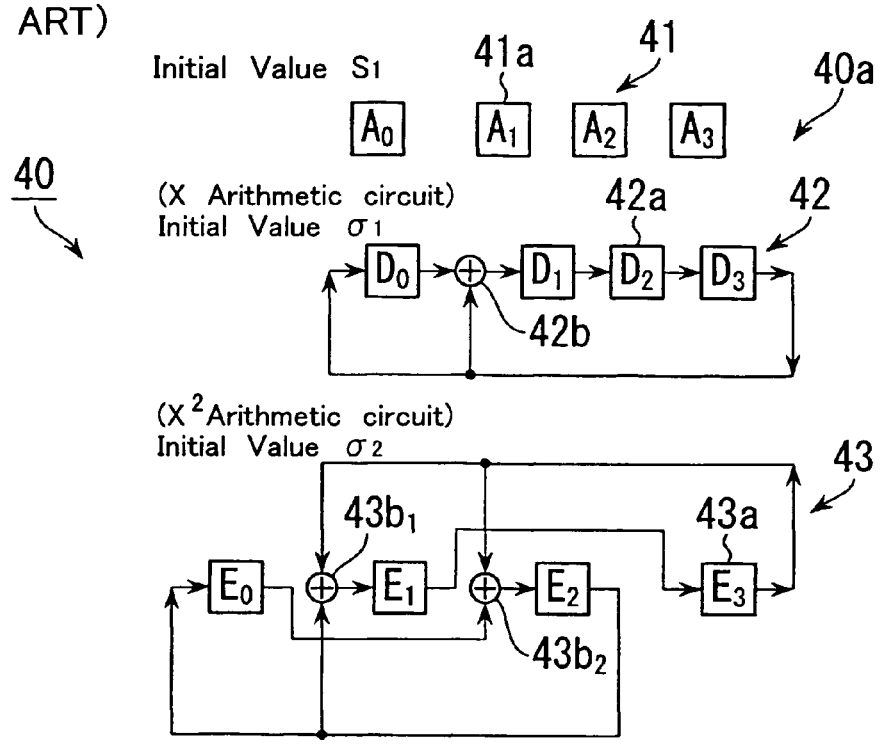
FIG. 25 is a block diagram showing a first arithmetic section contained in an error position detector in the conventional ECC circuit.

The $X^2$ arithmetic circuit 82 has the same arrangement as the $X^2$ arithmetic circuit 43 in FIG. 25: the shift register 43a corresponds to the shift register 82a; and the XOR circuits $43b_1$, $43b_2$ to the XOR circuits $82b_1$, $82b_2$. Therefore, detailed arrangement descriptions for those parts are omitted.

The $X^4$ arithmetic circuit 83 multiplies the value expressed by Expression (11) of the shift register 83a by $X^4$. Therefore, the shift register 83a has a value expressed by:

$$a_0 X^4+a_1 X^5+a_2 X^6+a_3 X^7 \tag{39}$$

From the $\alpha$ minimal polynomial $M_1(x)$, a relation of $X^4=X+1$ is derived. Accordingly:

$$(a_0+a_3)X^0+(a_0+a_1+a_3)X^1+(a_1+a_2)X^2+(a_2+a_3)X^3 \tag{40}$$

Based on Expression (40), the $X^4$ arithmetic section 83 through one shift operation performs: adding the values $a_0$, $a_3$ of the registers $E_0$, $E_3$ at the XOR circuit $83b_1$ and storing the sum into the register $E_0$; adding the values $a_0$, $a_1$, $a_3$ of the registers $E_0$, $E_1$, $E_3$ at the XOR circuit $83b_1$, $83b_2$ and storing the sum into the register $E_1$; adding the values $a_1$, $a_2$ of the registers $E_1$, $E_2$ at the XOR circuit $83b_3$ and storing the sum into the register $E_2$; and adding the values $a_2$, $a_3$ of the registers $E_2$, $E_3$ at the XOR circuit $83b_4$ and storing the sum into the register $E_3$.

Figure 26:
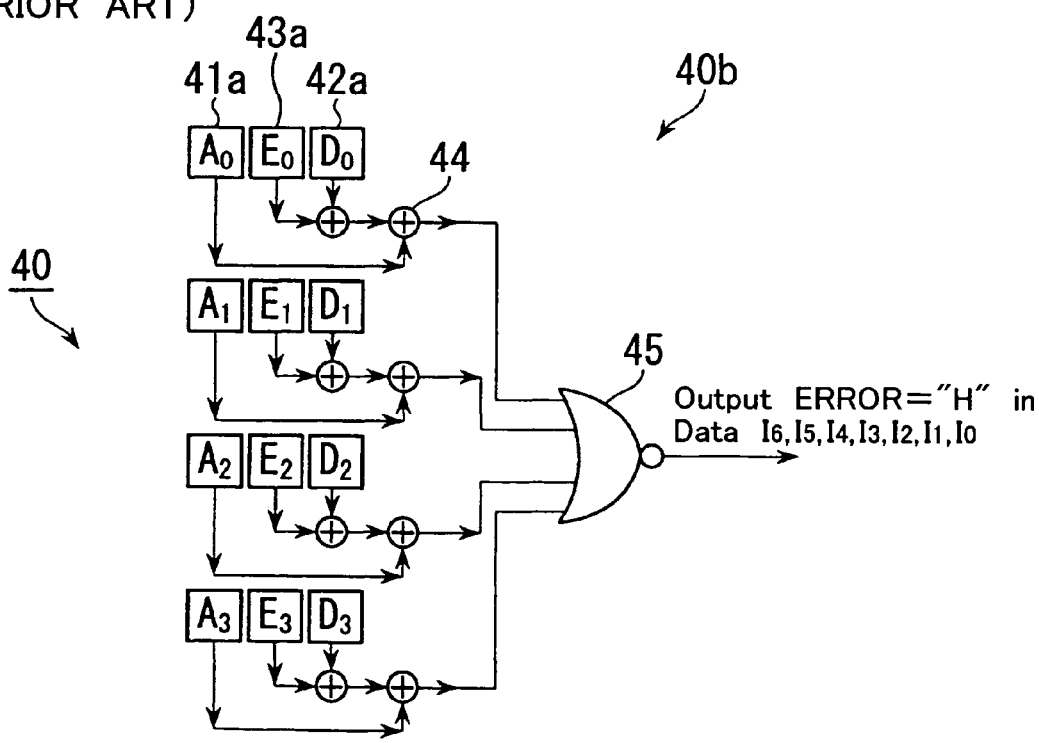
FIG. 26 is a block diagram showing a second arithmetic section contained in the error position detector in the conventional ECC circuit.

The second arithmetic section 80b in FIG. 6 includes a first detector 84 to detect error positions in the output data $I_0, I_2, I_4, I_6$; a second detector 85 to detect error positions in the output data $I_1, I_3, I_5$; an X-arithmetic circuit 86 to multiply the term of $\sigma_1$ by Z regarding the data $I_1, I_3, I_5$; and an $X^2$-arithmetic circuit 87 to multiply the term of $\sigma_2$ by $Z^2$ regarding the data $I_1, I_3, I_5$. The output resulted from the operation at the XOR circuit 88 and the NOR gate 89 in each detector 84, 85 exhibits "1" at the error position. This output is employed to invert the corresponding data Ii to detect 2-bit error positions in parallel at the same time by one shift operation. The X arithmetic circuit 86 and the $X^2$ arithmetic circuit 87 have the same arrangements as the conventional circuits shown in FIGS. 25 and 26 though they are not required to have registers for storing data.

(2) Second Embodiment

Figure 7:
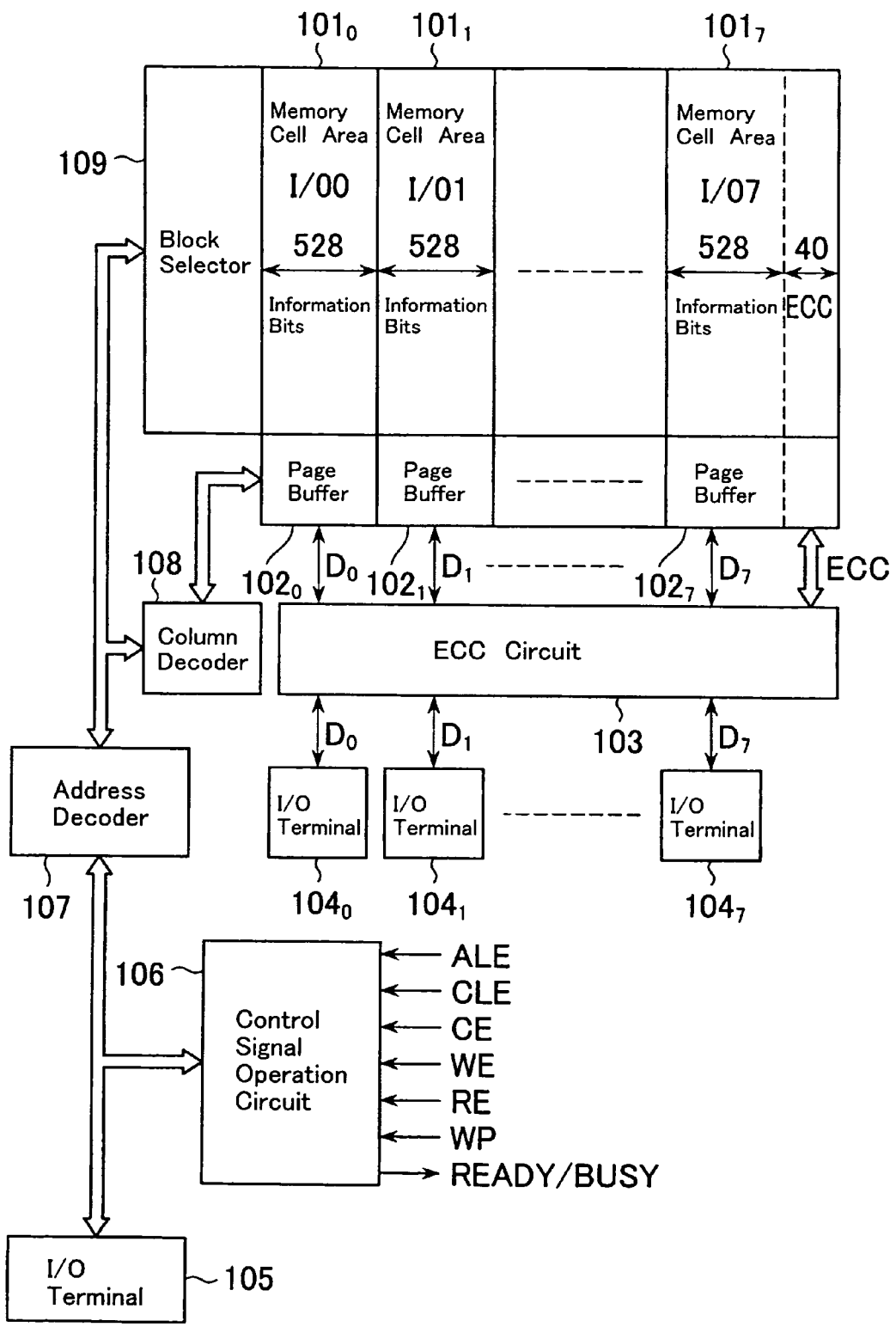
FIG. 7 is a block diagram showing a NAND-type flash memory according to a second embodiment of the present invention.

FIG. 7 is a block diagram showing a NAND-type flash memory according to a second embodiment, which mounts an ECC circuit on a chip.

The memory comprises eight memory cell areas $101_0$, $101_1$, $101_2$, ..., $101_7$. Eight page buffers $102_0$, $102_1$, $102_2$, ..., $102_7$ are provided corresponding to the memory cell areas $101_0$, $101_1$, $101_2$, ..., $101_7$ to temporarily store data to be written in and read out of the memory cell areas $101_0$, $101_1$, $101_2$, ..., $101_7$. Between the page buffers $102_0$-$102_7$ and I/O terminals $104_0$, $104_1$, ..., $104_7$, an ECC circuit 103 is provided to generate check bits, ECC, for correcting errors in the write data and to correct errors in the read data using the check bits (ECC). Different from the conventional type, for error detection and correction, the ECC circuit 103 adds 40 check bits commonly to information bits consisting of 528 bits×8 I/O=4224 bits data (M=528, N=8) that can be read out of and written into all memory cell areas $101_0$-$101_7$ at a time.

Addresses and control signals, input to an I/O terminal 105, are fed to a control signal operation circuit 106 and an address decoder 107, respectively. The control signal operation circuit 106 receives various control signals, ALE, CLE, CE, WE, RE, WP, generates control voltages supplied to various parts, and outputs a signal, READY/BUSY, to an external circuit. On receipt of an address from external through the I/O terminal 105, the address decoder 107 temporarily stores it and drives a column decoder 108 and a block selector 109. The column decoder 108 activates one column in each of the page buffers $102_0$-$102_7$. The block selector 109 applies a voltage to a word line in the memory cell areas $101_0$-$101_7$ required for reading, writing and erasing.

Figure 8:
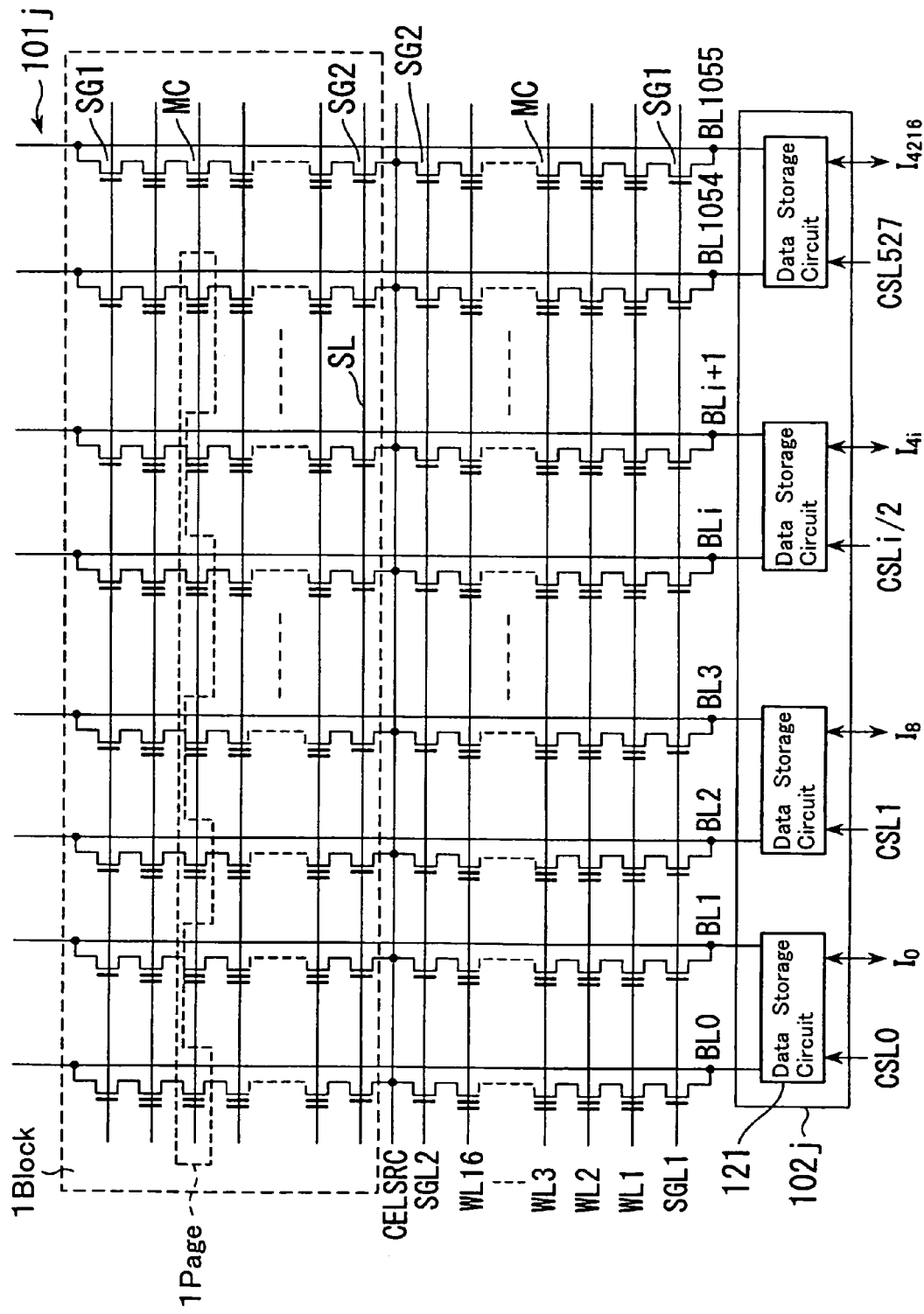
FIG. 8 is a circuit diagram showing an arrangement of a memory cell area in the flash memory.

As shown in FIG. 8, each memory cell area 101j (where j=0-7) includes electrically rewritable, nonvolatile memory cells MC arrayed in a matrix. In this example, 16 memory cells MC are serially connected in a unit. A drain of the memory cell MC at one end is connected to a bit line BL via a selection gate transistor SG1. A source of the memory cell MC at the other end is connected to a common source line SL via a selection gate transistor SG2. Control gates of the memory cells MC in the row direction are connected to a common word line WL. Gate electrodes of the selection gate transistors SG1, SG2 in the row direction are connected to a common selection gate line SGL1, SGL2. In this embodiment, data of 528 bits, stored in the memory cells arranged at odd or even numbers among 1056 memory cells MC along a control gate line, is treated as a page or a unit to be written or read at a time. In this example, data of 16 pages adjoining in the column direction is treated as a block or a unit to be erased at a time. In addition to 1056(528×2) memory cells MC arranged along a word line WL to store information bits, the memory cell area $101_7$ is further provided with memory cells MC to store 80(40×2) check bits for error correction.

As shown in FIG. 8, each page buffer 102j includes 528 data storage circuits 121. Each data storage circuit 121 is connected to two bit lines BLi, BLi+1. Data can be read out from a memory cell MC in the memory cell area 101j via either bit line BL selected by the address. A state of a memory cell MC in the memory cell area 101j can be detected via the bit line BL. Writing into a memory cell MC in the memory cell area 101j can be performed when a write control voltage is applied to the memory cell MC via the bit line BL. Among 528 data storage circuits 121, either one is selected at the column decoder 108 and only the selected data storage circuit 121 is connected to the ECC circuit 103.

Therefore, in the whole memory, the data storage circuits 121 of 8 bits (8-I/O) having the same column address are connected to the ECC circuit 103 by the column decoder 108. In a read operation, the memory cells MC of one page surrounded by a dashed line in FIG. 8 are selected, and data of 528×8 bits is stored in all data storage circuits 121 at a time. The column decoder 108 increments the column address by one in synchronization with the read enable (RE) signal input from external. As a result, one in each of the memory cell areas 101₀-101₇, eight data storage circuits 121 in total are selected in turn and 8-bit (8-I/O) data is sequentially output to the ECC circuit 103. In a write operation, 8-bit (8-I/O) data is sequentially input to the ECC circuit 103 from external via the I/O terminal 104₀-104₇, and the 8-bit data is sequentially output from the ECC circuit 103. The column decoder 108 increments the column address by one in synchronization with the write enable (WE) signal input from external. As a result, one in each of the memory cell areas 101₀-101₇, eight data storage circuits 121 in total are selected in turn, and 8-bit (8-I/O) data from the ECC circuit 103 is sequentially input to the selected storage circuit 121.

An ECC circuit 103 is explained next.

Figure 9:
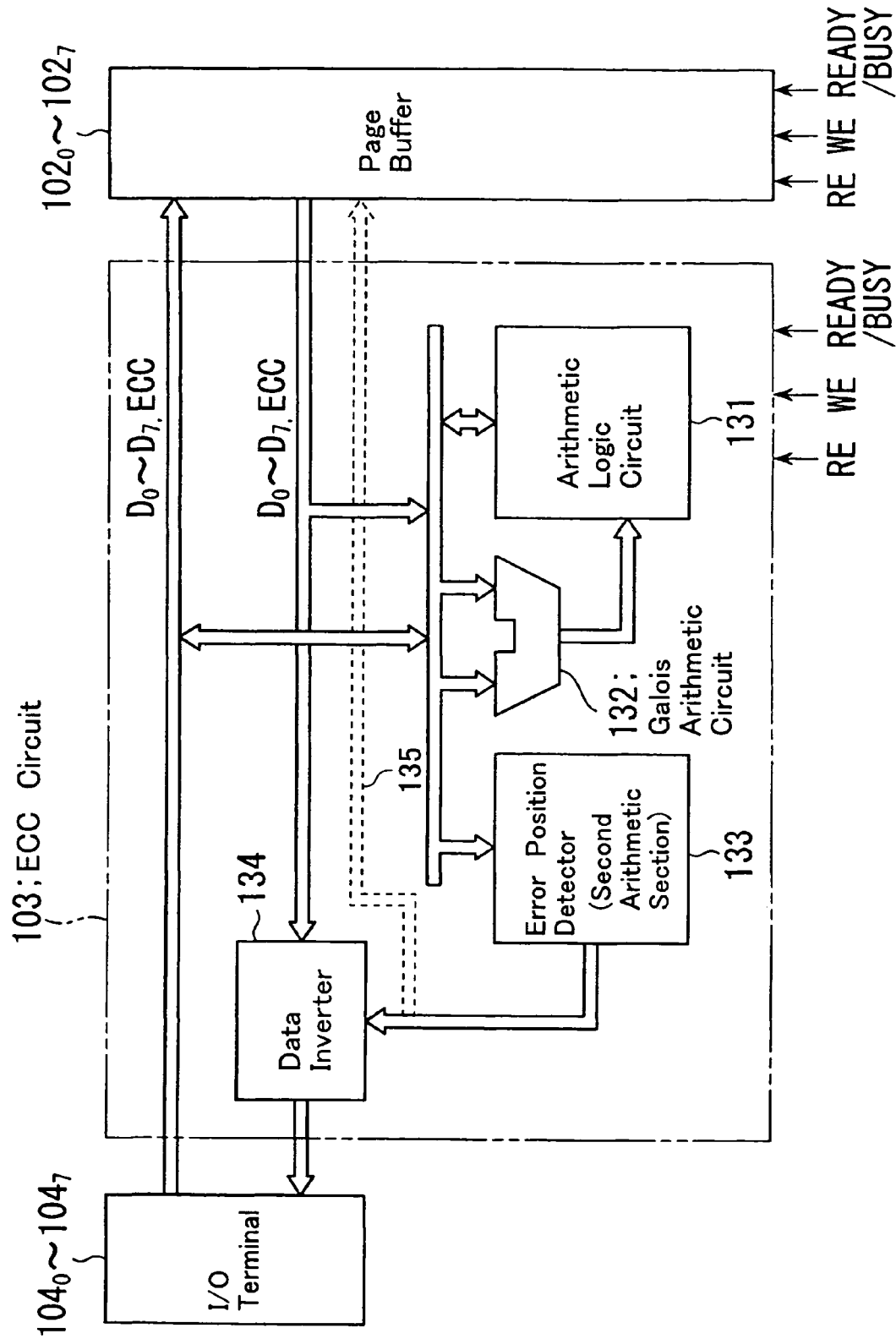
FIG. 9 is a block diagram showing an ECC circuit in the flash memory.

FIG. 9 is a block diagram showing the ECC circuit 103 in detail. The ECC circuit 103 includes an arithmetic logic circuit 131 containing multiple stages of registers, XOR circuits and switches; a Galois arithmetic circuit 132 for use in a syndrome computation and so forth; and an error position detector 133 (mainly a second arithmetic section) and a data inverter 134 operative to decode. The arithmetic logic circuit 131 configures a check bit generator when the ECC circuit 103 serves as a coder, and configures mainly the syndrome arithmetic circuit and a first arithmetic section in the error position detector when the ECC circuit 103 serves as a decoder.

(2-1) Coder

In the ECC circuit 103, data is input by 8 bits ($D_0$-$D_7$) to perform error detection and correction on a basis of data of 528×8=4228 bits. In the case of BCH code capable of correcting 3-bit errors and detecting 4-bit errors, the following condition can be considered: the number of information bits, k=4224; a code length, n=8191; the number of correction bits, t=3; and m=13. Therefore, a generating polynomial required for coding and decoding is given below:

$$\text{Fundamental Polynomial: } F(X) = X^{13} + X^4 + X^3 + X + 1 \qquad (41)$$

$$\text{Parity Polynomial: } M_0(x) = X + 1$$

$$\alpha \text{ Minimal Polynomial: } M_1(x) = X^{13} + X^4 + X^3 + X + 1$$

$$\alpha^3 \text{ Minimal Polynomial: } M_3(x) = X^{13} + X^{10} + X^9 + X^7 + X^5 + X^4 + 1$$

$$\alpha^5 \text{ Minimal Polynomial: } M_5(x) = X^{13} + X^{11} + X^8 + X^7 + X^4 + X^1 + 1$$

$$\begin{aligned}\text{Generating Polynomial: } G(x) &= M_0 M_1 M_3 M_5 \\ &= X^{40} + X^{39} + X^{38} + X^{35} + X^{34} + X^{33} + \\ &\quad X^{32} + X^{28} + X^{27} + X^{26} + X^{25} + \\ &\quad X^{23} + X^{22} + X^{20} + X^{18} + X^{17} + \\ &\quad X^{16} + X^{15} + X^{14} + X^{10} + X^9 + X^5 + \\ &\quad X^4 + X^2 + X^1 + 1\end{aligned}$$

Similar to the first embodiment, Expression (42) can be altered in Expression (43).

$$(((((0+I_0X^{39})X+I_1X^{39})X+I_2X^{39})X+I_3X^{39})\ldots)X+I_{527}X^{39})X \qquad (42)$$

$$(0+I_0X^{39}+I_1X^{38}+I_2X^{37}\ldots I_7X^{32})X^8+(I_8X^{39}\ldots I_{15}X^{32}))X^8\ldots(I_{520}X^{39}+I_{521}X^{38}\ldots I_{527}X^{32})X^8 \qquad (43)$$

Expression (43) means the following. The data of 8 bits $D_0$-$D_7$=$I_0, I_1, I_2, \ldots, I_7$, input by one clock of the WE signal, is multiplied on a bit basis by $X^{39}, X^{38}, X^{37}, \ldots, X^{32}$, respectively, and each product is added into an internal register value, which is then multiplied by $X^8$. Subsequently, the data of 8 bits $D_0$-$D_7$=$I_8, I_9, I_{10}, I_{15}$, input by the next clock of the WE signal, is multiplied on a bit basis by $X^{39}, X^{38}, X^{37}, \ldots, X^{32}$, respectively, and each product is added into an internal register value, which is then multiplied by $X^8$. The same operations are repeated 528 times to the data of last 8 bits $D_0$-$D_7$=$I_{4216}, I_{4217}, I_{4218}, \ldots, I_{4223}$.

Figure 10:
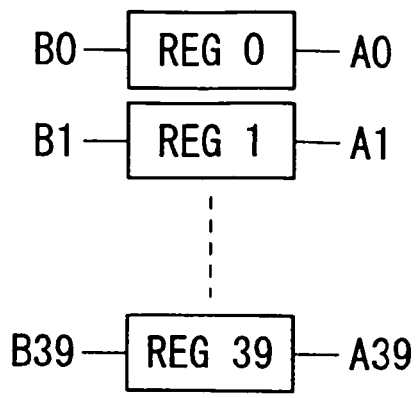
FIG. 10 shows registers contained in an arithmetic logic circuit on coding in the ECC circuit.

FIG. 10 shows 40-stage registers REG0, REG1, ..., REG39 equipped in the arithmetic logic circuit 131. These registers configure a cyclic shift register in the coder. The registers REG0, REG1, ..., REG39 have Inputs B0, B1, ..., B39 and Outputs A0, A1, ..., A39. Based on the above generating polynomial (41) and Expression (43), the arithmetic logic circuit 131 executes XOR operations represented by the following Expressions (45) and (46) for one data input. The XOR operations herein employed are represented by Expression (44). Prior to sending the Outputs A32-A39, the registers REG32-REG39 sends Outputs AA32-AA39, which are resulted from XOR operations as shown by Expression (45) to add 8-bit data $D_0$-$D_7$ fed from external to register values. Outputs A0-31 and AA32-AA39 are led to XOR circuits. The results from the XOR operations, B0-B39, represented by Expression (46), are led to Inputs of the registers REG0-REG39 and fetched in synchronization with the shift register clock. When this operation is repeated 528 times, 40 check bits $I_{4224}, I_{4225}, I_{4226}, \ldots, I_{4264}$ are generated in the registers REG0-REG39 of the arithmetic logic circuit 131.

XOR3(IN1,IN2,IN3)=XOR2(XOR2(IN1,IN2),IN3)

XOR4(IN1,IN2,IN3,IN4)=XOR2(XOR3(IN1,IN2,IN3),IN4)

XOR5(IN1,IN2,IN3,IN4,IN5)=XOR2(XOR4(IN1,IN2,IN3,IN4),IN5)

XOR6(IN1,IN2,IN3,IN4,IN5,IN6)=XOR2(XOR5(IN1,IN2,IN3,IN4,IN5),IN6)

XOR7(IN1,IN2,IN3,IN4,IN5,IN6,IN7)=XOR2(XOR6(IN1,IN2,IN3,IN4,IN5,IN6),IN7)  (44)

$AA39$=XOR2($A39,D0$)

$AA38$=XOR2($A38,D1$)

$AA37$=XOR2($A37,D2$)

$AA36$=XOR2($A36,D3$)

$AA35$=XOR2($A35,D4$)

$AA34$=XOR2($A34,D5$)

$AA33$=XOR2($A33,D6$)

$AA32$=XOR2($A32,D7$)  (45)

$B0$=XOR6($A32,A33,A35,A36,A37,A39$)

$B1$=XOR5($A32,A34,A35,A38,A39$)

$B2$=XOR2($A32,A37$)

$B3$=XOR2($A33,A38$)

$B4$=XOR6($A32,A33,A34,A35,A36,A37$)

$B5$=XOR4($A32,A34,A38,A39$)

$B6$=XOR3($A33,A35,A39$)

$B7$=XOR2($A34,A36$)

$B8$=XOR3($A0,A35,A37$)

$B9$=XOR7($A1,A32,A33,A35,A37,A38,A39$)

$B10$=XOR6($A2,A32,A34,A35,A37,A38$)

$B11$=XOR6($A3,A33,A35,A36,A38,A39$)

$B12$=XOR5($A4,A34,A36,A37,A39$)

$B13$=XOR4($A5,A35,A37,A38$)

$B14$=XOR6($A6,A32,A33,A35,A37,A38$)

$B15$=XOR6($A7,A32,A34,A35,A37,A38$)

$B16$=XOR4($A8,A32,A37,A38$)

$B17$=XOR6($A9,A32,A35,A36,A37,A38$)

$B18$=XOR4($A10,A32,A35,A38$)

$B19$=XOR4($A11,A33,A36,A39$)

$B20$=XOR7($A12,A32,A33,A34,A35,A36,A39$)

$B21$=XOR6($A13,A33,A34,A35,A36,A37$)

$B22$=XOR6($A14,A32,A33,A34,A38,A39$)

$B23$=XOR5($A15,A32,A34,A36,A37$)

$B24$=XOR5($A16,A33,A35,A37,A38$)

$B25$=XOR7($A17,A32,A33,A34,A35,A37,A38$)

$B26$=XOR5($A18,A32,A34,A37,A38$)

$B27$=XOR5($A19,A32,A36,A37,A38$)

$B28$=XOR5($A20,A32,A35,A36,A38$)

$B29$=XOR5($A21,A33,A36,A37,A39$)

$B30$=XOR4($A22,A34,A37,A38$)

$B31$=XOR4($A23,A35,A38,A39$)

$B32$=XOR5($A24,A32,A33,A35,A37$)

$B33$=XOR7($A25,A32,A34,A35,A37,A38,A39$)

$B34$=XOR4($A26,A32,A37,A38$)

$B35$=XOR6($A27,A32,A35,A36,A37,A38$)

$B36$=XOR6($A28,A33,A36,A37,A38,A39$)

$B37$=XOR5($A29,A34,A37,A38,A39$)

$B38$=XOR6($A30,A32,A33,A36,A37,A38$)

$B39$=XOR6($A31,A32,A34,A35,A36,A38$)  (46)

Figure 11:
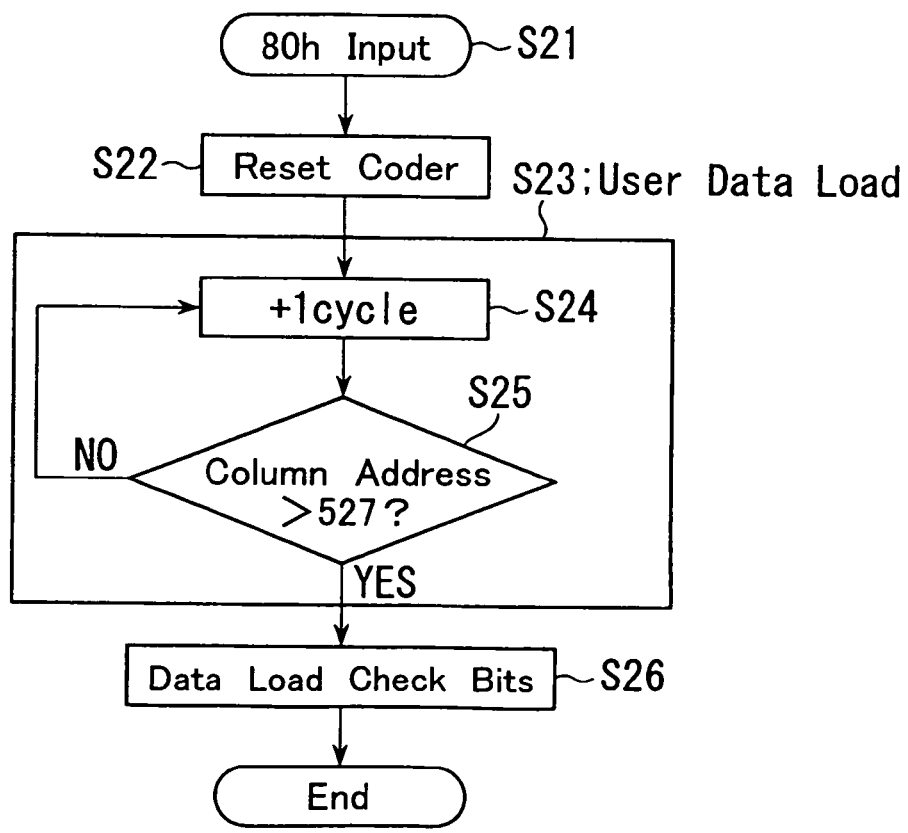
FIG. 11 is a flowchart showing an operation of coding in the coder.
Figure 12:
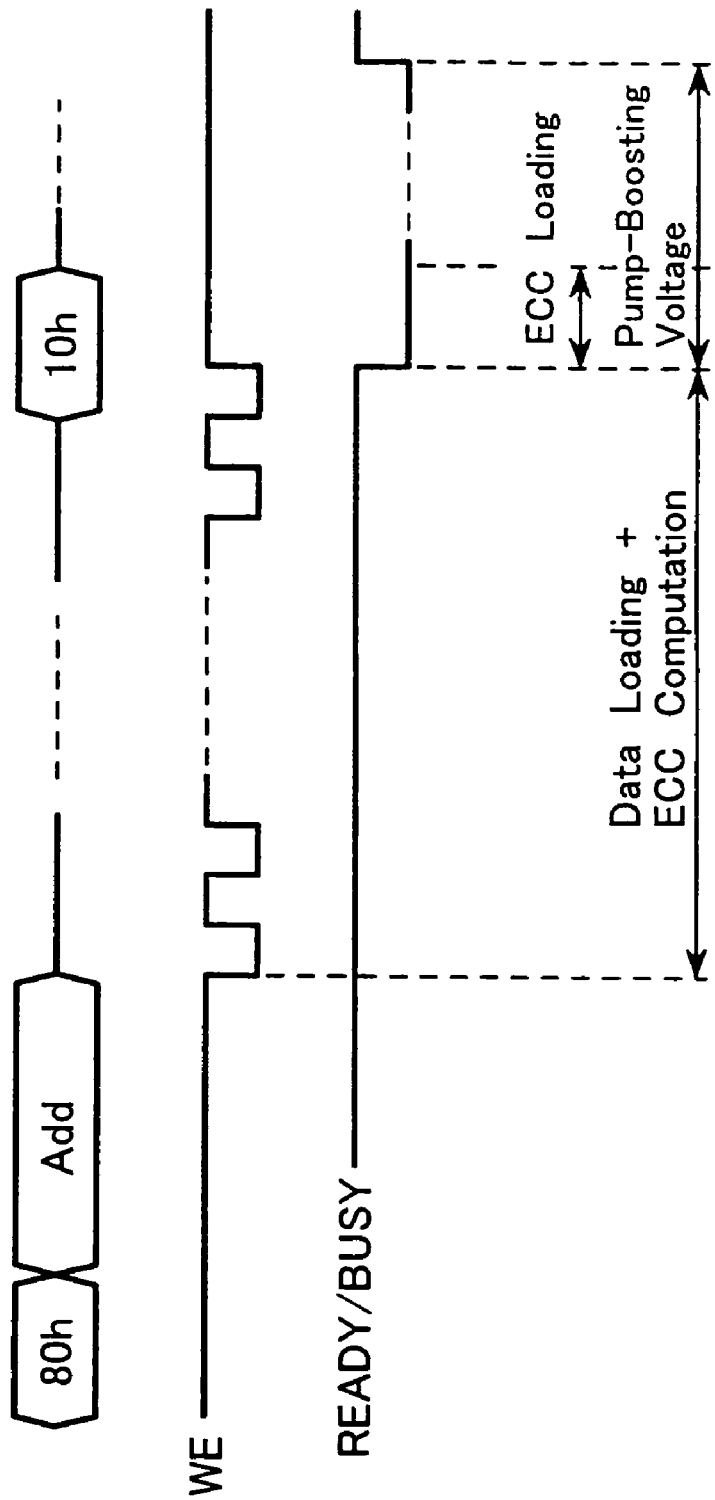
FIG. 12 is a timing chart on coding.

FIG. 11 is a flowchart showing an operation of coding in the ECC circuit 103 and FIG. 12 is a timing chart on coding in the same.

When a data input command (80h) enters from external (S21), the registers REG0-40 in the arithmetic logic circuit 131 are reset (S22), then an address (Add) is given. Subsequently, a WE (Write Enable) signal enters from external and, in synchronization with this signal, data is loaded by 8 bits into the page buffer 102j (S23, S24, S25). At the same time, the data is sent to the arithmetic logic circuit 131 to compute check bits. When the column address reaches the last 528 (S25), the data loading is terminated. Subsequently, a program command (10h) enters from external, and an operation of voltage boosting by a charge pump, not depicted, is started to write data into the memory cell MC. At the same time, prior to writing, check bits are output, using the internal oscillator and so forth, not depicted, from 40 bits REG0-REG39 by 5 bytes sequentially, and stored in the data storage circuit 121 of the page buffer $102_7$. The data stored in the data storage circuit 121 is then written into the memory cells MC in the page (surrounded by the dashed line in FIG. 8) selected by the external address Add.

(2-2) Decoder

① Syndrome Computational Circuits

For 3-bit error correction and 4-bit error detection, four syndromes $S_0$, $S_1$, $S_3$, $S_5$ are required as it is known. The syndrome $S_0$ can be derived from the minimal polynomial $M_1(X)=X^4+X+1$. When $X^{10}=X^3+1$, derived from the minimal polynomial $M_1(x)=X^{10}+X^3+1$, is referred to as an a operator, the syndrome $S_1$ can be derived from the a operator, the syndrome $S_3$ from an $\alpha^3$ operator, and the syndrome $S_5$ from an $\alpha^5$ operator. Only one bit can enter by one clock of the WE signal in the conventional decoder. In contrast, 8-bit data can be fetched by one clock of the WE signal in this embodiment by altering Expressions similar to the first embodiment that alters Expression from (27) to (28), and Expression from (34) to (35). Accordingly, the syndrome $S_1$ can be derived from an $\alpha^8$-operator, the syndrome $S_3$ from an $\alpha^{24}$ operator, and the syndrome $S_5$ from an $\alpha^{40}$ operator.

Figure 13:
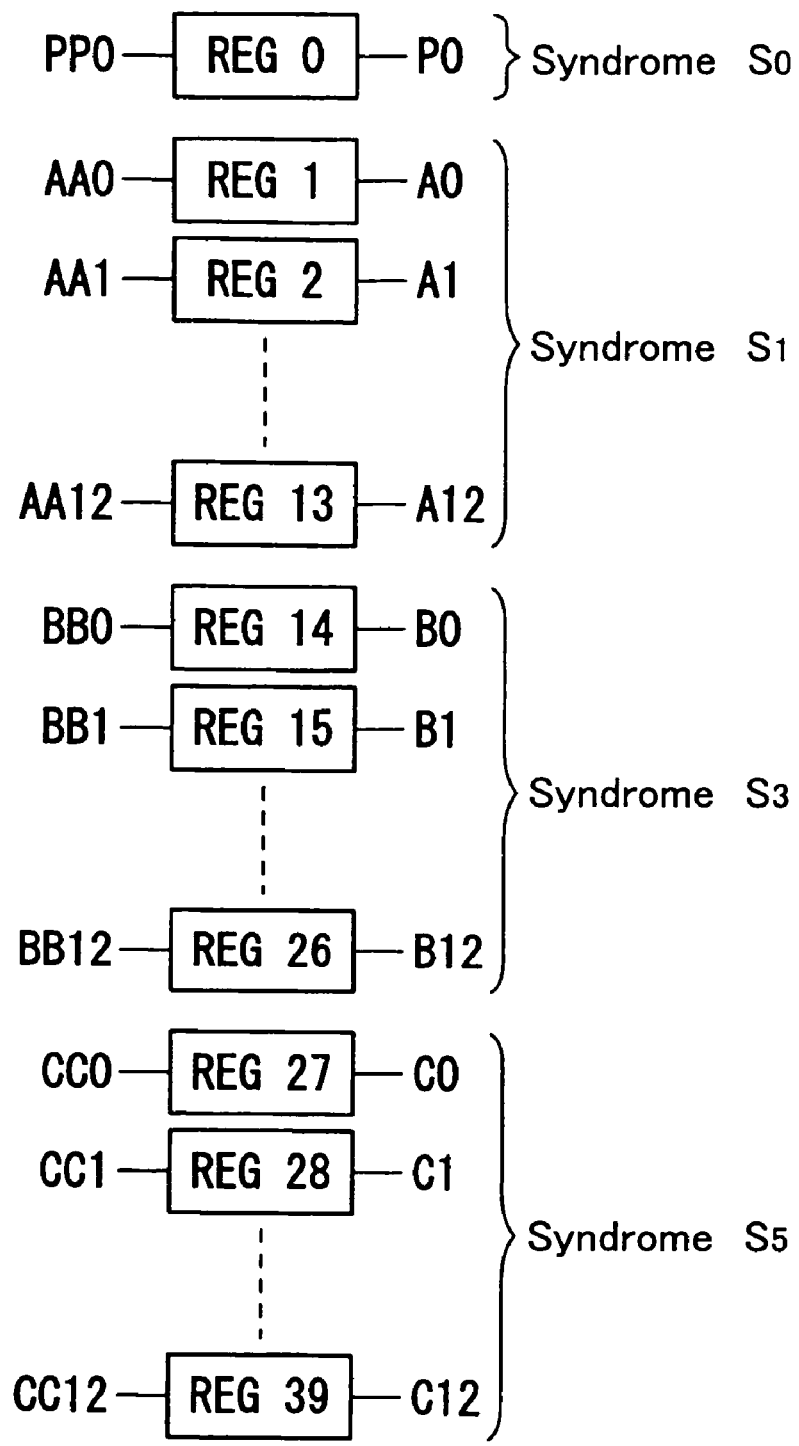
FIG. 13 shows registers contained in an arithmetic logic circuit for decoding in the ECC circuit.

FIG. 13 shows 40-stage registers REG0, REG1, REG39 equipped in the arithmetic logic circuit 131. The register REG0 configures a cyclic shift register in the $S_0$ syndrome computational circuit. The registers REG1-13 configure a cyclic shift register in the $S_1$ syndrome computational circuit. The registers REG14-26 configure a cyclic shift register in the $S_3$ syndrome computational circuit. The registers REG27-39 configure a cyclic shift register in the $S_5$ syndrome computational circuit. The register REG0 has an Input PP0 and an Output P0. The registers REG1-13 have Inputs AA0, AA1, . . . , AA12 and Outputs A0, A1, . . . , A12. The registers REG14-26 have Inputs BB0, BB1, BB12 and Outputs B0, B1, . . . , B12. The registers REG27-39 have Inputs CC0, CC1, . . . , CC12 and Outputs C0, C1, . . . , C12. The arithmetic logic circuit 131 executes operations shown in Expressions (47), (48), (49) and (50) based on one data input. The 8-bit data D0-D7 read out of the data storage circuit 121 is added to the Outputs P0, A0-13, B0-13, C0-13 from the registers REG0-REG39 at XOR circuits. The Outputs PP0, AA0-13, BB0-13, CC0-13 from the XOR circuits are led to the inputs of the registers REG0-39 and fetched in synchronization with the shift register clock. The XOR circuits connected to the registers REG1-13 configure an $\alpha^8$ arithmetic circuit, which receives the data D0-D7 input. The XOR circuits connected to the registers REG14-26 configure an $\alpha^{24}$ arithmetic circuit, which receives the data D0-D7 input. The XOR circuits connected to the registers REG27-39 configure an $\alpha^{40}$ arithmetic circuit, which receives the data D0-D7 input. In stead of the $\alpha^{40}$ arithmetic circuit, because it has a large circuit scale, $\alpha^{40}$ may be fed into one of inputs of the Galois arithmetic circuit 132 shown in FIG. 9, and the output thereof and the data D0-D7 are appropriately operated at XOR circuits.

<Computation of Syndrome $S_0$>

$$PP0=XOR9(P0,D7,D6,D5,D4,D3,D2,D1,D0) \quad (47)$$

<Computation of Syndrome $S_1$>

$$AA0=XOR2(A5,D7)$$
$$AA1=XOR3(A5,A6,D6)$$
$$AA2=XOR3(A6,A7,D5)$$
$$AA3=XOR4(A5,A7,A8,D4)$$
$$AA4=XOR5(A5,A6,A8,A9,D3)$$
$$AA5=XOR5(A6,A7,A9,A10,D2)$$
$$AA6=XOR5(A7,A8,A10,A11,D1)$$
$$AA7=XOR5(A8,A9,A11,A12,D0)$$
$$AA8=XOR4(A0,A9,A10,A12)$$
$$AA9=XOR3(A1,A10,A11)$$
$$AA10=XOR3(A2,A11,A12)$$
$$AA11=XOR2(A3,A12).$$
$$AA12=A4 \quad (48)$$

<Computation of Syndrome $S_3$>

$$BB0=XOR5(B1,B2,B7,B9,D7)$$
$$BB1=XOR7(B0,B1,B3,B7,B8,B9,B10)$$
$$BB2=XOR8(B1,B2,B4,B8,B9,B10,B11,D2)$$
$$BB3=XOR10(B0,B1,B3,B5,B7,B10,B11,B12,D6,D2)$$
$$BB4=XOR8(B0,B4,B6,B7,B8,B9,B11,B12)$$
$$BB5=XOR9(B1,B5,B7,B8,B9,B10,B12,D2,D1)$$
$$BB6=XOR10(B0,B2,B6,B8,B9,B10,B11,D5,D2,D1)$$
$$BB7=XOR7(B1,B3,B7,B9,B10,B11,B12)$$
$$BB8=XOR8(B2,B4,B8,B10,B11,B12,D1,D0)$$
$$BB9=XOR8(B3,B5,B9,B11,B12,D4,D1,D0)$$
$$BB10=XOR4(B4,B6,B10,B12)$$
$$BB11=XOR5(B0,B5,B7,B11,D0)$$
$$BB12=XOR7(B0,B1,B6,B8,B12,D3,D0) \quad (49)$$

<Computation of Syndrome $S_5$>

$$CC0=XOR13(C0,C1,C2,C4,C5,C7,C8,C9,C10,C11,C12,D7,D2)$$
$$CC1=XOR5(C3,C4,C6,C7,D2)$$
$$CC2=XOR8(C0,C4,C5,C7,C8,D4,D2,D0)$$
$$CC3=XOR10(C2,C4,C6,C7,C10,C11,C12,D4,D2,D0)$$
$$CC4=XOR9(C0,C1,C2,C3,C4,C9,C10,D1,D0)$$
$$CC5=XOR11(C0,C1,C2,C3,C4,C5,C10,C11,D6,D4,D2)$$
$$CC6=XOR12(C0,C1,C2,C3,C4,C5,C6,C11,C12,D4,D1,D0)$$
$$CC7=XOR11(C1,C2,C3,C4,C5,C6,C7,C12,D3,D2,D0)$$
$$CC8=XOR10(C0,C2,C3,C4,C5,C6,C7,C8,D3,D0)$$
$$CC9=XOR10(C0,C1,C3,C4,C5,C6,C7,C8,C9,D0)$$
$$CC10=XOR12(C1,C2,C4,C5,C6,C7,C8,C9,C10,D5,D3,D1)$$
$$CC11=XOR12(C0,C2,C3,C5,C6,C7,C8,C9,C10,C11,D3,D0)$$
$$CC12=XOR13(C0,C1,C3,C4,C6,C7,C8,C9,C10,C11,C12,D2,D1) \quad (50)$$

① Error Position Detector (First Arithmetic Section)

Figure 14:
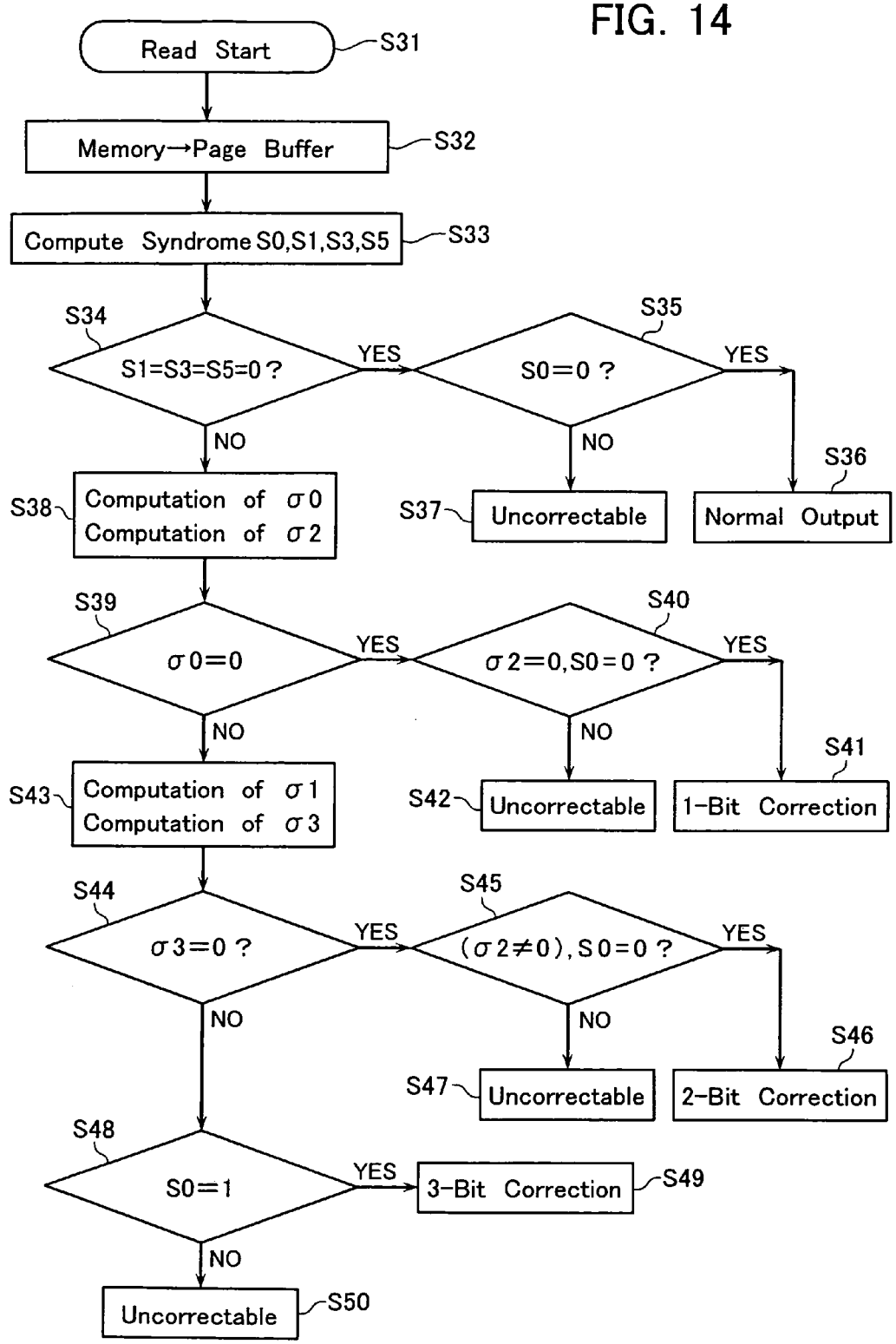
FIG. 14 is a flowchart showing an operation of decoding.

FIG. 14 is a flowchart showing an operation of decoding in the ECC circuit 103.

A data read command (00h) is input, then a read address (Add) from external to start reading (S31). The data of one page (528 bytes) selected by the address is read out from the memory cells MC into the page buffers $102_0$-$102_7$ (S32). Thereafter, in synchronization with a signal oscillated from the internal oscillator, the data D0-D7 is input byte by byte to the ECC circuit 103 to compute the syndrome (S33). As shown in FIG. 27, after computations of the syndromes $S_0$, $S_1$, $S_3$, $S_5$, if $S_1=S_3=S_5=0$ (S34) and if $S_0=0$ (S35), it is determined errorless (Normal output: S36). If $S_0 \neq 0$ (S35), it is determined uncorrectable (S37). Unless $S_1=S_3=S_5=0$ (S34), computations are made for $\sigma_2=S_1^2 S_3+S_5$ and $\sigma_0=S_1^3+S_3$ (S38). If $\sigma_0=0$ (S39) and if $\sigma_2=0$ and $S_0=0$ (S40), it is determined 1-bit error, and the control goes to an algorithm for 1-bit error correction (S41). Unless $\sigma_2=0$ and $S_0=0$ (S40), it is determined uncorrectable (S42). If $\sigma_0 \neq 0$ (S39), computations are made for $\sigma_1=S_1(S_1^3+S_3)$ and $\sigma_3=(S_1^3+S_3)^2+S_1(S_1^2 S_3+S_5)$ (S43). If $\sigma_3=0$ (S44) and if $\sigma_2 \neq 0$ and $S_0=0$ (S45), it is determined 2-bit errors, and the control goes to an algorithm for 2-bit error correction (S46). Unless $\sigma_2 \neq 0$ and $S_0=0$ (S45), it is determined uncorrectable (S47). If $\sigma_3 \neq 0$ (S44) and if $S_0=1$ (S48), it is determined 3-bit errors, and the control goes to an algorithm for 3-bit error correction (S49). The algorithm for 2-bit error correction is same as that for 3-bit error correction. If $S_0 \neq 1$ (S48), it is determined uncorrectable (S50).

Figure 15:
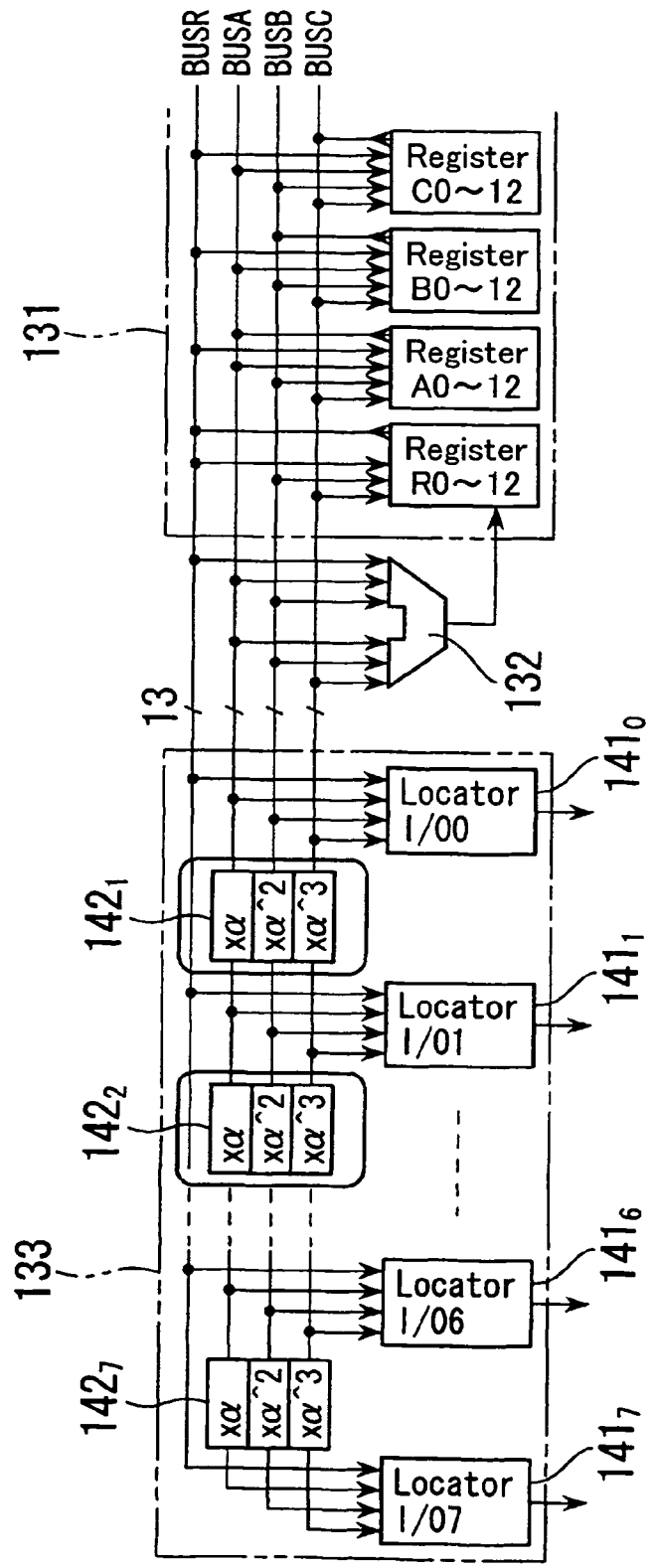
FIG. 15 is a block diagram of an error position detector in the ECC circuit.

FIG. 15 shows an error position detector that executes the above computations. This error position detector includes a first arithmetic section, consisting of four registers R, A, B, C of 13 bits each, and not-depicted XOR circuits, contained in the arithmetic logic circuit 131. The error position detector also includes a Galois arithmetic circuit 132, and a second arithmetic section 133 consisting of eight locators 141 and arithmetic circuits 142 interposed between the locators 141 to operate $\times \alpha$, $\times \alpha^2$, $\times \alpha^3$. 13-bit buses BUSR, BUSA, BUSB, BUSC are provided to connect them. The output from the Galois arithmetic circuit 132 is connected to the register R.

Figure 16:
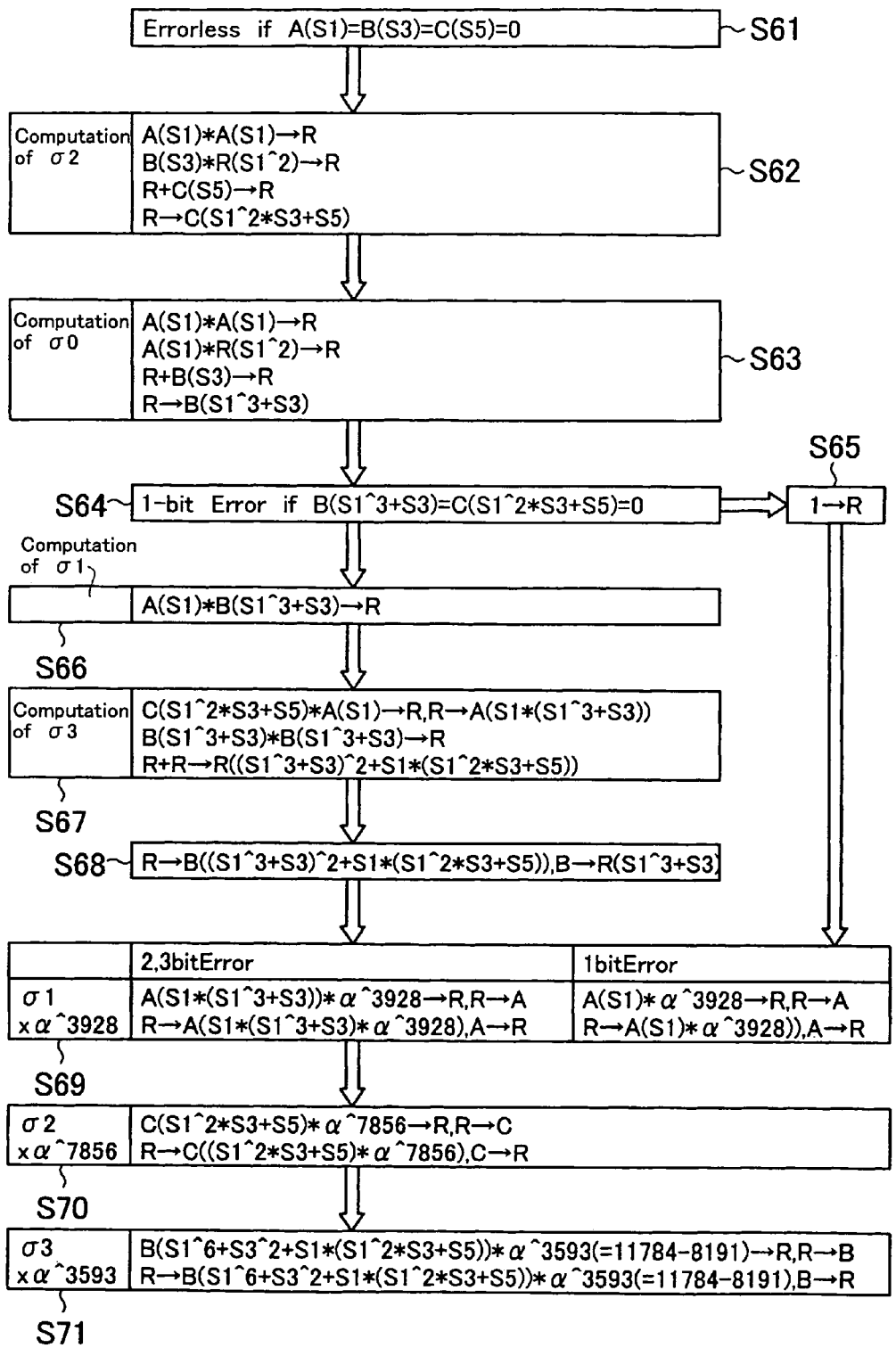
FIG. 16 is a flowchart showing an algorithm for computing each term in an error position polynomial in the error position detector.

FIG. 16 shows an algorithm to compute the terms of the error position polynomial, $\sigma_0$, $\sigma_1$, $\sigma_2$, $\sigma_3$. The registers A, B, C store the syndromes $S_1$, $S_3$, $S_5$, respectively. If these syndromes are all zero, it is determined errorless and no operation is executed (S61). If not, an operation is made for $\sigma_2=S_1^2 S_3+S_5$ and the operated result is sequentially stored in the register R. The operated result finally obtained is transferred from the register R to the register C (S62). Next, an operation is made for $\sigma_0=S_1^3+S_3$ and the operated result is sequentially stored in the register R. The operated result finally obtained is transferred from the register R to the register B (S63). If the operated results stored in the registers B, C are both zero, then it is determined 1-bit error (S64) and "1" is stored in the register R (S65). If not, computations are made for $\sigma_1=S_1(S_1^3+S_3)$ and $\sigma_3=(S_1^3+S_3)^2+S_1(S_1^2 S_3+S_5)$ (S66, S67, S68).

In the present embodiment, of the code length of n=8191, the information bits of k=4224 (528×8 bits) are subjected to the error correction, while the information bits can have 8151 bits except for 41 check bits originally in a code having the code length of n=8191. As a result, the error position is shifted by 8151−4224+1=3928 bits. On reading from a column address of 0, computations are performed to multiply $\sigma_1$ by $\alpha^{3928}$, $\sigma_2$ by $\alpha^{7856(=3928 \times 2)}$, and $\sigma_3$ by $\alpha^{3593(=3928 \times 3-8191)}$ (S69, S70, S71). Similarly, on reading from a column address of i, computations are performed to multiply $\sigma_1$ by $\alpha^{3928+i}$, $\sigma_2$ by $\alpha^{7858(=(3928+i) \times 2)}$, and $\sigma_3$ by $\alpha^{3596(=(3928+i) \times 3-8191)}$. Factors such as $\alpha^{3928+i}$ are written into a ROM, for example. The factor is stored in the vicinity of the column data storage or in the memory cell area 101, selected by the column selector 108 of FIG. 7, because it depends on the column address of i. Alternatively, only the factor at the column address of 0 is stored and, when another address is accessed, a dummy operation of detecting an error position is performed to provide a matched factor.

FIG. 17 is a block diagram showing the Galois arithmetic circuit 132 in detail.

Figure 17A:
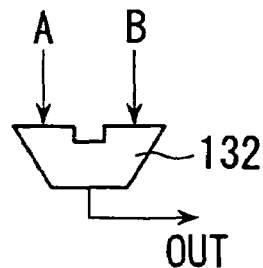
FIGS. 17A, 17B and 17C are block diagrams of a Galois arithmetic circuit in the ECC circuit.

13-bit inputs A and B shown in FIG. 17A are respectively represented by:

$$A = a_0 X^0 + a_1 X^1 + a_2 X^2 + \ldots + a_{12} X^{12}$$

$$B = b_0 X^0 + b_1 X^1 + b_2 X^2 + \ldots + b_{12} X^{12} \quad (51)$$

In this case, A×B can be represented by:

$$\begin{aligned} A \times B &= A(b_0 X^0 + b_1 X^1 + b_2 X^2 + \ldots + b_{12} X^{12}) \\ &= Ab_0 + X(Ab_1 + X(Ab_2 + X(Ab_3 + \ldots + X(Ab_{12}))))))))))) \end{aligned} \quad (52)$$

Figure 17B:
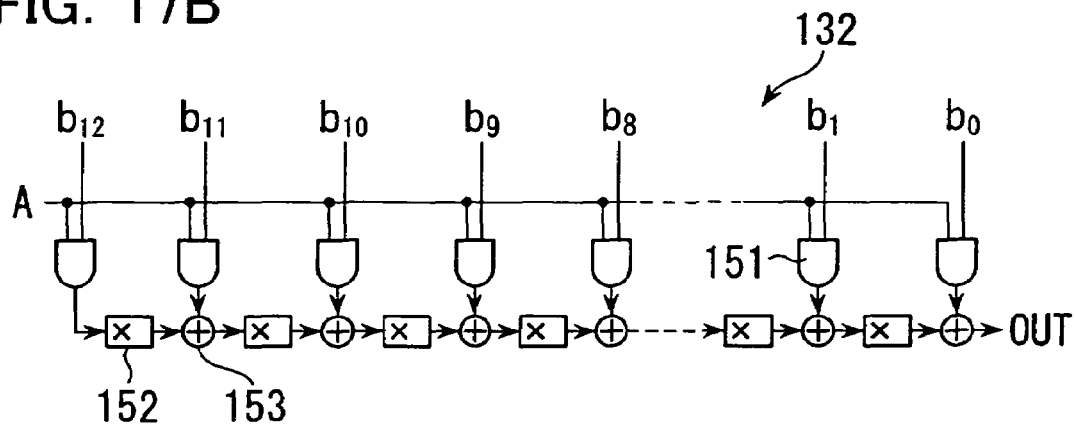
Figure 17C:
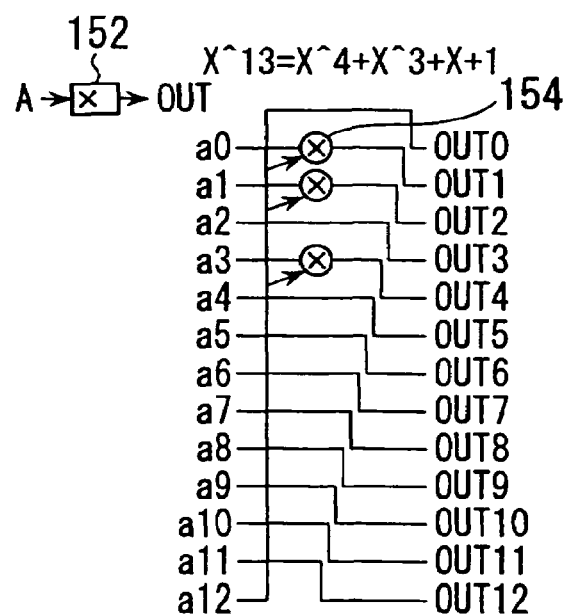

This circuit can be configured as shown in FIG. 17B, in which A and $b_i$ are subjected to the AND operation at an AND circuit 151. The operated result is then multiplied by X at an X multiplier 152, and the product is subjected at an XOR circuit 153 to the XOR operation with the AND-operated result from the next A and $b_{i+1}$. From the a Minimal Polynomial $M_1(x)$ in Expression (41), a relation of $X^{13}=X^4+X^3+X+1$ is present. Therefore, as shown in FIG. 17C, the X multiplier 152 operates shifting the term of $X^{12}$ into the term of $X^0$; adding it into the terms of $X^3$, $X^1$, $X^0$ by the XOR circuit 154; and storing it in the terms of $X^4$, $X^3$, $X^1$.

As a result of the above operations, 13-bit registers A, B, C, D are given $\sigma_1$, $\sigma_3$, $\sigma_2$, $\sigma_0$ as initial values, respectively.

② Error Position Detector (Second Arithmetic Section)

Error bit positions can be detected based on the following error position polynomial (53) in the cases of 3-bit correction and 4-bit correction as it is known.

$$\sigma(Z) = S_1 + \sigma_1 \times Z + \sigma_2 \times Z^2 + \sigma_3 \times Z^3 \quad (53)$$

When $Z=\alpha^I$ (I=0, 1, 2, 3, …) is assigned in turn to Expression (53), the position of the error can be indicated by i that holds $\sigma(\alpha^i)=0$. In the present embodiment, as 8-bit data is output per WE clock, Expression (53) is altered to Expression (54), like Expression (10) is altered to Expression (38) in the first embodiment.

$$\sigma(Z) = \sigma_0 + \sigma_1 \times Z^8 + \sigma_2 \times Z^{16} + \sigma_3 \times Z^{24} \quad (54)$$

As a result, the error detection can be performed by 8 bits simultaneously at every other 8 bits. In a word, of the output data of 8 I/O, the error detection is performed to the I/O 0. If an error is present, then $\sigma=0$. As a result of the computations in FIG. 16, the 13-bit registers A, B, C, D are given $\sigma_1$, $\sigma_3$, $\sigma_2$, $\sigma_0$ as initial values, respectively. The XOR circuits connected to the register A in the arithmetic logic circuit 131 configure an $\alpha^8$ arithmetic circuit. The XOR circuits connected to the register B configure an $\alpha^{24}$ arithmetic circuit. The XOR circuits connected to the register C configure an $\alpha^{16}$ arithmetic circuit. The register A has Inputs AA0, AA1, …, AA12 and Outputs A0, A1, …, A12. The register B has Inputs BB0, BB1, …, BB12 and Outputs B0, B1, B12. The register C has Inputs CC0, CC1, …, CC12 and Outputs C0, C1, …, C12. In this case, the $\alpha^8$, $\alpha^{16}$, $\alpha^{24}$ arithmetic circuits perform operations respectively represented by Expressions (55), (56) and (57):

$AA0=A5$ $AA1=XOR2(A5,A6)$ $AA2=XOR2(A6,A7)$ $AA3=XOR3(A5,A7,A8)$ $AA4 = \text{XOR4}(A5, A6, A8, A9)$ $AA5 = \text{XOR4}(A6, A7, A9, A10)$ $AA6 = \text{XOR4}(A7, A8, A10, A11)$ $AA7 = \text{XOR4}(A8, A9, A11, A12)$ $AA8 = \text{XOR4}(A0, A9, A10, A12)$ $AA9 = \text{XOR3}(A1, A10, A11)$ $AA10 = \text{XOR3}(A2, A11, A12)$ $AA11 = \text{XOR2}(A3, A12)$ $AA12 = A4$ (55)

<$\alpha^{16}$ Arithmetic Circuit>

$CC0 = \text{XOR4}(C6, C7, C9, C10)$ $CC1 = \text{XOR4}(C6, C8, C9, C11)$ $CC2 = \text{XOR4}(C7, C9, C10, C12)$ $CC3 = \text{XOR6}(C0, C6, C7, C8, C9, C11)$ $CC4 = \text{XOR5}(C0, C1, C6, C8, C12)$ $CC5 = \text{XOR4}(C1, C2, C7, C9)$ $CC6 = \text{XOR5}(C0, C2, C3, C8, C10)$ $CC7 = \text{XOR6}(C0, C1, C3, C4, C9, C11)$ $CC8 = \text{XOR6}(C1, C2, C4, C5, C10, C12)$ $CC9 = \text{XOR5}(C2, C3, C5, C6, C11)$ $CC10 = \text{XOR5}(C3, C4, C6, C7, C12)$ $CC11 = \text{XOR4}(C4, C5, C7, C8)$ $CC12 = \text{XOR4}(C5, C6, C8, C9)$ (56)

<$\alpha^{24}$ Arithmetic Circuit>

$BB0 = \text{XOR4}(B1, B2, B7, B9)$ $BB1 = \text{XOR7}(B0, B1, B3, B7, B8, B9, B10)$ $BB2 = \text{XOR7}(B1, B2, B4, B8, B9, B10, B11)$ $BB3 = \text{XOR8}(B0, B1, B3, B5, B7, B10, B11, B12)$ $BB4 = \text{XOR8}(B0, B4, B6, B7, B8, B9, B11, B12)$ $BB5 = \text{XOR7}(B1, B5, B7, B8, B9, B10, B12)$ $BB6 = \text{XOR7}(B0, B2, B6, B8, B9, B10, B11)$ $BB7 = \text{XOR7}(B1, B3, B7, B9, B10, B11, B12)$ $BB8 = \text{XOR6}(B2, B4, B8, B10, B11, B12)$ $BB9 = \text{XOR5}(B3, B5, B9, B11, B12)$ $BB10 = \text{XOR4}(B4, B6, B10, B12)$ $BB11 = \text{XOR4}(B0, B5, B7, B11)$ $BB12 = \text{XOR5}(B0, B1, B6, B8, B12)$ (57)

Figure 18:
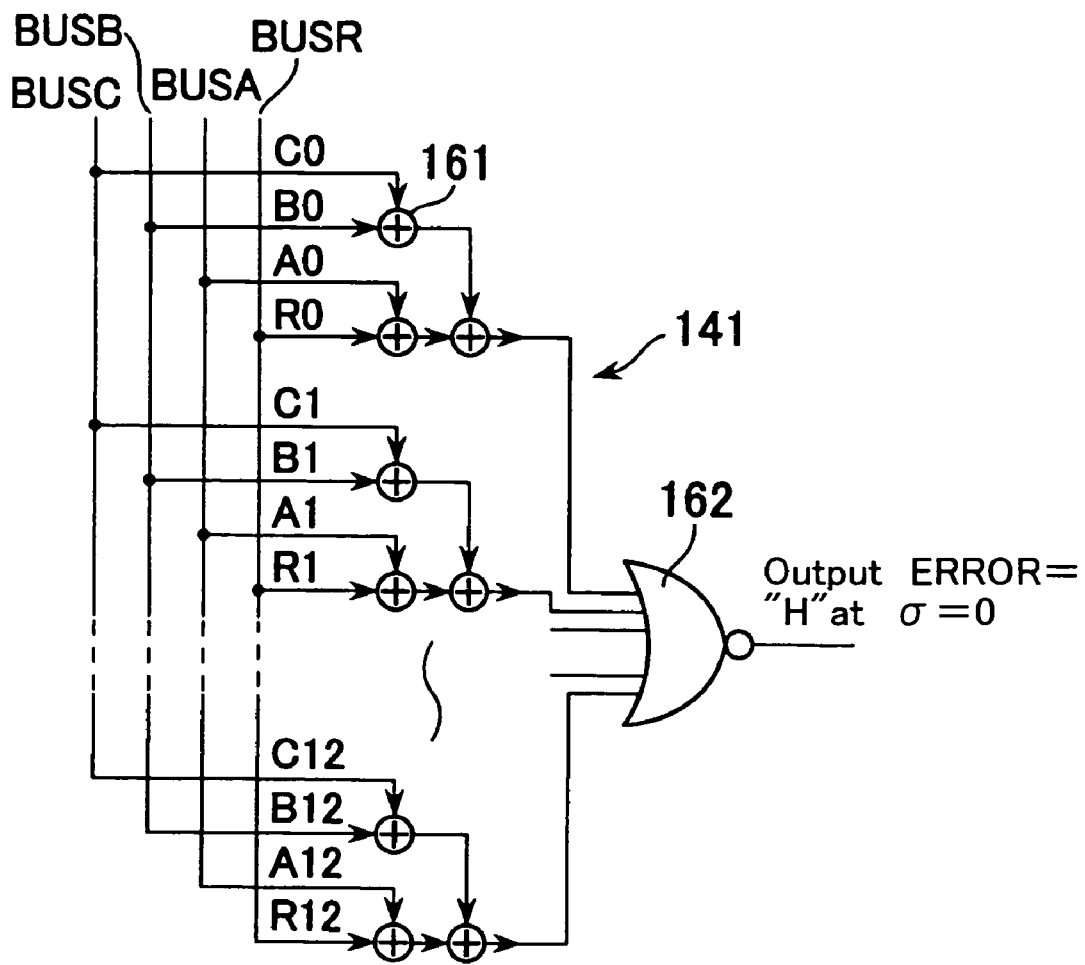
FIG. 18 shows a second arithmetic section in the error position detector.

FIG. 18 is a circuit diagram showing a specific arrangement of the locator 141. The locator 141 includes XOR circuits 161 and NOR circuits 162 to compute $\sigma(Z)$ and outputs "H" if an error is present ($\sigma=0$) at the I/O 0 (j=1-7). As a result, the data inverter 134 of FIG. 9 inverts the data from the data storage circuit 121 in the page buffer 102$_0$ and outputs the inverted data. Alternatively, as indicated by a dashed arrow 135 in FIG. 9, error correction can be directly performed to the data at the error position in the page buffer 102.

On the other hand, the data at the I/O 1 has values in $\sigma(Z)$ with the term of $\sigma_1$ multiplied by Z, the term of $\sigma_2$ multiplied by $Z^2$, and the term of $\sigma_3$ multiplied by $Z^3$. Accordingly, as shown in FIG. 15, an arithmetic circuit 142$_1$ is mounted to operate the term of $\sigma_1 \times X$, the term of $\sigma_2 \times X^2$, and the term of $\sigma_2 \times X^3$, and supplies the output to the locator 141$_1$ to solve the error position polynomial. If an error is detected ($\sigma=0$), the output comes to "H". When these X, $X^2$, $X^3$ arithmetic circuits are assumed to have Inputs X0-X12 and Outputs Y0-Y12, the arithmetic circuits execute the following operations. The arithmetic circuits are not required to have registers to store data.

<X Arithmetic Circuit>

$Y0 = X12$ $Y1 = \text{XOR2}(X0, X12)$ $Y2 = X1$ $Y3 = \text{XOR2}(X2, X12)$ $Y4 = \text{XOR2}(X3, X12)$ $Y5 = X4$ $Y6 = X5$ $Y7 = X6$ $Y8 = X7$ $Y9 = X8$ $Y10 = X9$ $Y11 = X10$ $Y12 = X^{11}$ (58)

<$X^2$ Arithmetic Circuit>

$Y0 = X11$ $Y1 = \text{XOR2}(X11, X12)$ $Y2 = \text{XOR2}(X0, X12)$ $Y3 = \text{XOR2}(X1, X11)$ $Y4 = \text{XOR3}(X2, X11, X12)$ $Y5 = \text{XOR2}(X3, X12)$ $Y6 = X4$ $Y7 = X5$ $Y8 = X6$ $Y9 = X7$ $Y10 = X8$

Y11=X9

Y12=X10     (59)

<X³ Arithmetic Circuit>

Y0=X10

Y1=XOR2(X10,X11)

Y2=XOR2(X11,X12)

Y3=XOR3(X0,X10,X12)

Y4=XOR3(X1,X10,X11)

Y5=XOR3(X2,X11,X12)

Y6=XOR2(X3,X12)

Y7=X4

Y8=X5

Y9=X6

Y10=X7

Y11=X8

Y12=X9     (60)

The data at the I/O 2 has values in σ(Z) with the term of $\sigma_1$ multiplied by $Z^2$, the term of $\sigma_2$ multiplied by $Z^4$, and the term of $\sigma_3$ multiplied by $Z^6$. If arithmetic circuits are mounted to operate the term of $\sigma_1 \times X^2$, the term of $\sigma_2 \times X^4$, and the term of $\sigma_2 \times X^6$ on the basis of I/O 0, the arithmetic circuit for a large multiplication such as $X^6$ increases the circuit scale. Therefore, in this embodiment, an arithmetic circuit $141_1$ is provided to multiply the output from the arithmetic circuit $141_2$ by ×X, ×X², ×X³ again. Similarly, arithmetic circuits are provided up to $141_7$ corresponding to the I/O 7.

Figure 19:
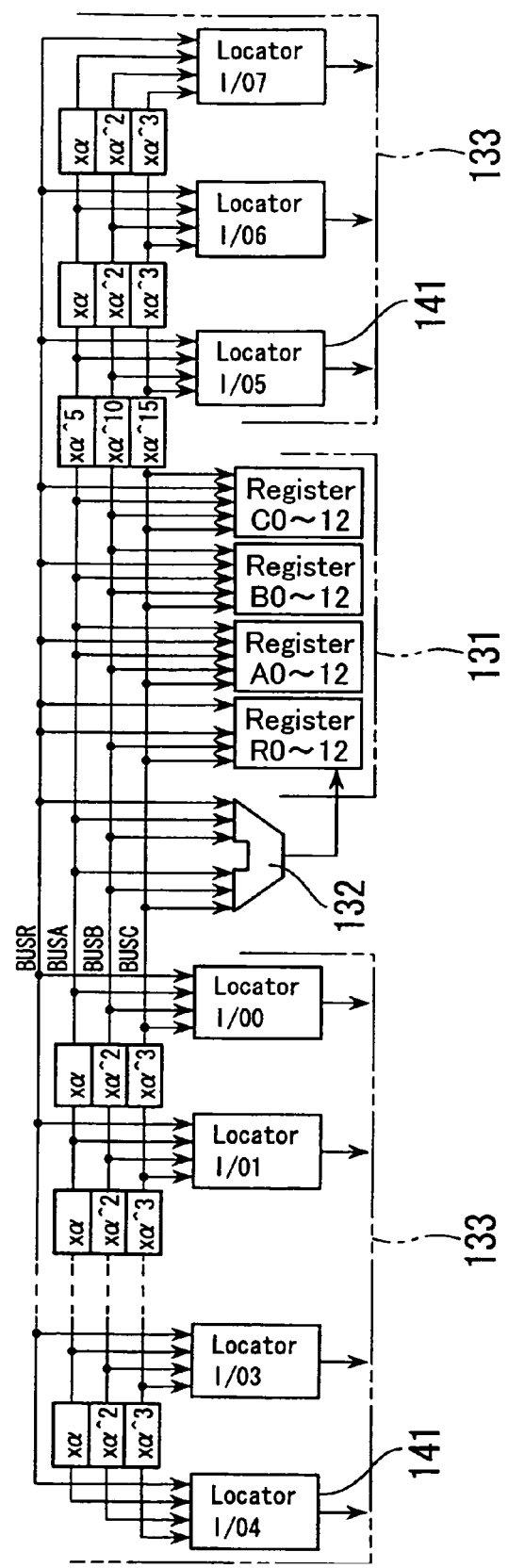
FIG. 19 is a block diagram of another error position detector in the ECC circuit.
Figure 21:
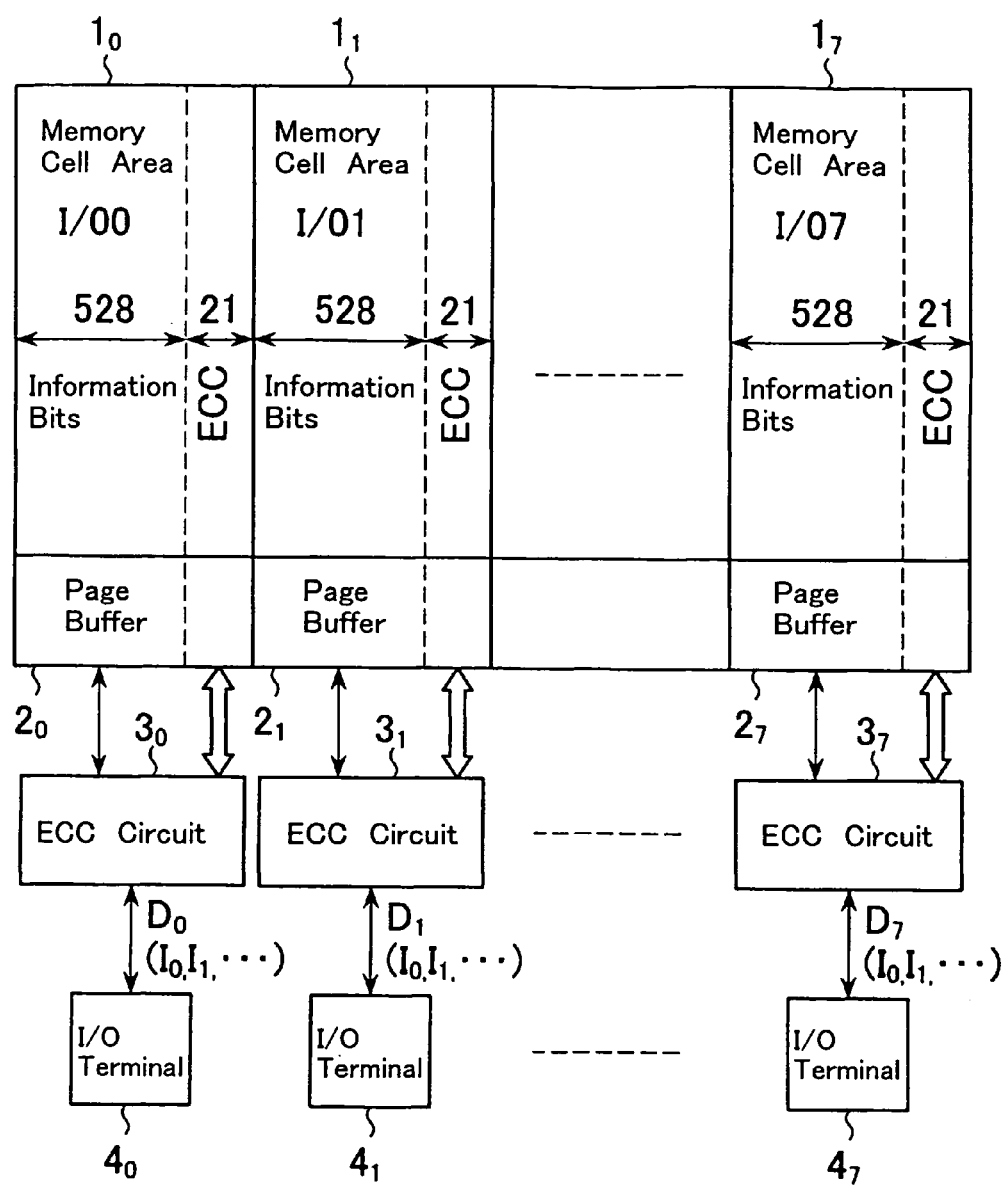
FIG. 21 is a block diagram showing an arrangement of the NAND-type flash memory with conventional ECC circuits mounted thereon.

If there is a problem on a signal transmission time delay, the eight locators 141 configuring the error position detector (second arithmetic section) 133 may be divided in two groups of four locators, as shown in FIG. 19, which are arranged on both sides of the arithmetic logic circuit 131. This arrangement is effective to halve the signal transmission path to the locator 141.

FIG. 20 is a timing chart on decoding in the ECC circuit 103. FIG. 20A shows data reading and error correcting after computations of all terms in the error position polynomial.

When a data read command (00h) is input from external, followed by a read address (Add), a READY/BUSY signal is activated to start reading. First, the data of one page (528 bytes) selected by the address is read out from the memory cells MC into the page buffers $102_0$-$102_7$. Then, in synchronization with a signal oscillated from the internal oscillator, the data D0-D7 is input byte by byte to the ECC circuit 103 to compute the syndromes and operate the terms of the error position polynomial using the computed syndromes $S_0$, $S_1$, $S_3$, $S_5$. Thereafter, the data is read out in synchronization with the write enable (RE) signal and the error correction is executed at the same time. In this case, compared to the absence of the ECC circuit 103, an additional busy time is derived from a computation time for syndromes plus a computation time for error correction operators in total. For example, if one syndrome computation requires 50 ns and an arithmetic time for an operator is equal to 3.6 μs, then 528×50 ns+3.6 μs=30 μs.

FIG. 20B shows an example of computing the syndromes $S_0$, $S_1$, $S_3$, $S_5$ at the same time of data reading. After the reading is started similarly, the data of one page (528 bytes) is read out from the memory cells MC into the page buffers $102_0$-$102_7$. Then, the data is output from the page buffers $102_0$-$102_7$ byte by byte in synchronization with the RE signal and the ECC circuit 103 computes the syndromes. As a result of the syndrome computation, if an error is detected, a status fail command (70h) is activated. Accordingly, an operator for error correction is computed and the data is output again to correct the error. In this case, if no error is present, an additional busy time in total is equal to zero.

As for 2-bit error correction and 3-bit error detection, the number of permissible random failures (the number of random failures at a device failure probability of 1 ppm) is naturally better in the case of 528 information bits than in the case of 4224 information bits. Table 1 shows an application to a 256 Mb NAND-type flash memory.

From Table 1, the number of permissible random failures is 100 bits at 2-bit correction BCH code for 528 information bits, and only 30 bits for 4224 information bits. To the contrary, at 3-bit correction BCH code for 4224 information bits, the random failures can be permitted up to 300 bits with a necessary code as short as 40 bits. Further, at 4-bit correction BCH code for 4224 information bits, the random failures can be permitted up to 1000 bits with a necessary code as short as 53 bits effectively.

TABLE 1

Number of random failures in 256 Mb at Device failure probability of 1 ppm

|  | Code length per Page (528B) | Number of Failures |
| --- | --- | --- |
| 2-bit correction BCH code (528 information bits) | 21 × 8 = 168 bits | 100 bits |
| 2-bit correction BCH code (4224 information bits) | 27 bits | 30 bits |
| 3-bit correction BCH code (4224 information bits) | 40 bits | 300 bits |
| 4-bit correction BCH code (4224 information bits) | 53 bits | 1000 bits |

Table 2 shows chip sizes of NAND-type flash memories of 128 M-bits and 512 M-bits when no ECC circuit is mounted, compared with those when the conventional 2-bit correction ECC circuit is mounted, and those when the 2-bit correction ECC circuit of the present embodiment is mounted.

TABLE 2

|  | 128M (0.16 μm) | 512M (0.16 μm) |
| --- | --- | --- |
| No ECC circuit | 41.88 mm² (100.0%) | 136.99 mm² (100.0%) |
| ECC circuit mounted (Conventional) | 44.72 mm² (106.8%) | 143.96 mm² (105.1%) |
| ECC circuit mounted (Embodiment) | 43.21 mm² (103.2%) | 140.42 mm² (102.5%) |

Thus, the flash memory with the conventional ECC circuit mounted thereon has an increase in chip size of 6.8% (128M) and 5.1% (512M). To the contrary, the flash memory with the ECC circuit of the present embodiment mounted thereon has an increase in chip size of 3.2% (128M) and 2.5% (512M), which is half the conventional one.

As obvious from the forgoing, the information bits are generated per M-bit that is a unit for accessing each memory area in the art. To the contrary, according to the embodiments of the invention, N bits can be processed in parallel. Therefore, it is possible to allocate a set of check bits to M×N bits and reduce the number of check bits in total relative to the number of information bits. This is effective to improve a chip integration density while mounting an on-chip error correction circuit.

Having described the embodiments consistent with the invention, other embodiments and variations consistent with the invention will be apparent to those skilled in the art. Therefore, the invention should not be viewed as limited to the disclosed embodiments but rather should be viewed as limited only by the spirit and scope of the appended claims.

What is claimed is:

1. A semiconductor device, comprising:
   A pieces of memory cell areas, each of which includes a plurality of memory cells;
   a plurality of buffers, each of which is coupled to one of the memory cell areas to temporarily store data to be written into said memory cell area and data read out from the memory cell area; and
   an error correction circuit including a coder configured to generate check bits for error correcting and to attach said check bits to data to be written into said memory cell areas and a decoder configured to process for error correcting said data read out from said memory cell areas with said generated check bits,
   said error correction circuit treats K=B×A bits (where B denotes a natural number) as an information bit length, generates H check bits for said information bit length, and treats (K+H) bit data as a unit to be written or read at a time from or to said A pieces of memory cell areas.

2. The semiconductor device according to claim 1, wherein said H check bits are BCH code.

3. The semiconductor device according to claim 1, wherein said memory cell area includes a NAND type memory block in which a plurality of memory cells are connected in series.

4. The semiconductor device according to claim 1, wherein said memory cell area includes the memory cells connected to one of word lines to store 1 page data and said check bit.

5. The semiconductor device according to claim 1, wherein said decoder comprises:
   a syndrome computational circuit configured to compute a syndrome from said information bits and said check bits input;
   an error position detector having a first arithmetic section configured to compute a term in an error position polynomial from said computed syndrome, and a second arithmetic section configured to compute an error position polynomial from said computed term in said error position polynomial and detect an error position; and
   a data inverter configured to conduct a data inversion process for data read out from said memory cell area at said error position detected.

6. The semiconductor device according to claim 5, wherein said coder, said syndrome computational circuit and said first arithmetic section are configured by switching registers and arithmetic circuits contained in an arithmetic logic circuit.

7. The semiconductor device according to claim 5, further comprising a Galois arithmetic circuit employed to compute said syndrome or said term in said error position polynomial.

8. The semiconductor device according to claim 5,
   wherein said second arithmetic section including a plurality of locators and a plurality of arithmetic circuits each connected between said locators, and
   wherein said first arithmetic section is connected to said second arithmetic section with a plurality of buses.

9. The semiconductor device according to claim 5,
   wherein said second arithmetic section is arranged dividedly on both sides of said first arithmetic section.

10. A semiconductor device comprising an error correction circuit including a decoder configured to process data for error correcting with check bits,
    said decoder comprising:
    a syndrome computational circuit configured to compute a syndrome receiving input of (K+H) bit data generated by attaching H check bits to information bit data of K=B×A bits (where B denotes a natural number), the (K+H) bit data being output from A pieces of memory cell areas at a time;
    an error position detector having a first arithmetic section configured to compute a term in an error position polynomial from said computed syndrome, and a second arithmetic section configured to compute an error position polynomial from said computed term in said error position polynomial and detect an error position, and
    a data inverter configured to conduct a data inversion process for said data at said error position detected.

11. The semiconductor device according to claim 10,
    wherein said second arithmetic section includes a plurality of locators and a plurality of arithmetic circuits each connected between said locators, and
    wherein said first arithmetic section is connected to said second arithmetic section with a plurality of buses.

12. The semiconductor device according to claim 10,
    wherein said second arithmetic section is arranged dividedly on both sides of said first arithmetic section.

* * * * *